(12) United States Patent
Brunton

(10) Patent No.: US 8,785,228 B2
(45) Date of Patent: Jul. 22, 2014

(54) METHOD AND APPARATUS FOR DIVIDING THIN FILM DEVICE INTO SEPARATE CELLS

(75) Inventor: Adam North Brunton, Oxford (GB)

(73) Assignee: M-Solv Ltd., Oxford (GB)

( * ) Notice: Subject to any disclaimer, the term of this patent is extended or adjusted under 35 U.S.C. 154(b) by 292 days.

(21) Appl. No.: 13/144,541

(22) PCT Filed: Apr. 15, 2010

(86) PCT No.: PCT/GB2010/000754
§ 371 (c)(1),
(2), (4) Date: Jul. 14, 2011

(87) PCT Pub. No.: WO2011/048352
PCT Pub. Date: Apr. 28, 2011

(65) Prior Publication Data
US 2011/0275193 A1    Nov. 10, 2011

(30) Foreign Application Priority Data

Oct. 22, 2009 (GB) .................................. 0918481.3

(51) Int. Cl.
*H01L 21/00* (2006.01)

(52) U.S. Cl.
USPC .......................................................... 438/47

(58) Field of Classification Search
None
See application file for complete search history.

(56) References Cited

U.S. PATENT DOCUMENTS

| | | | |
|---|---|---|---|
| 6,310,281 B1 | 10/2001 | Wendt et al. | |
| 6,919,530 B2 | 7/2005 | Borgeson et al. | |
| 2003/0213974 A1* | 11/2003 | Armstrong et al. | 257/184 |
| 2008/0230922 A1* | 9/2008 | Mochizuki et al. | 257/777 |

FOREIGN PATENT DOCUMENTS

| | | | |
|---|---|---|---|
| GB | 2 458 986 | 10/2009 | |
| GB | 2458986 | * 10/2009 | ............. B65H 20/04 |

(Continued)

OTHER PUBLICATIONS

International Search Report issued in PCT Application No. PCT/GB2010/000754 dated Nov. 23, 2010.

(Continued)

*Primary Examiner* — Charles Garber
*Assistant Examiner* — Andre' C Stevenson
(74) *Attorney, Agent, or Firm* — Ked & Associates, LLP

(57) ABSTRACT

A method and apparatus for dividing a thin film device having a first layer which is a lower electrode layer, a second layer which is an active layer and a third layer which is an upper electrode layer, the layers each being continuous over the device, into separate cells which are electrically interconnected in series. The dividing of the cells and the electrical connection between adjacent cells are carried out in a single pass of a process head across the device, the process head performing the following steps in me single pass: a) making a first cut through the first, second and third layers; b) making a second cut through the second and third layers, the second cut being adjacent to the first cut; c) making a third cut through the third layer the third cut being adjacent to the second cut and on the opposite side of the second cut to the first cut; d) using a first ink jet print head to deposit a non-conducting material into the first cut; and e) using a second ink jet print head to apply conducting material to bridge the non-conducting material in the first cut and either fury or partially fill the second cut such to form an electrical connection between the first layer and the third layer, wherein step (a) precedes step (d), step (d) precedes step (e) and step (b) precedes step (e), (otherwise the steps may be earned out in any order in the single pass of the process head across the device). The thin film device may be a solar panel, a lighting panel or a battery

19 Claims, 11 Drawing Sheets

(56) References Cited

FOREIGN PATENT DOCUMENTS

| | | |
|---|---|---|
| JP | 10-209475 | 8/1998 |
| WO | WO 2007/044555 | 4/2007 |

OTHER PUBLICATIONS

United States Office Action dated Apr. 24, 2013 issued in U.S. Appl. No. 13/183,597.

\* cited by examiner

METHOD AND APPARATUS FOR DIVIDING THIN FILM DEVICE INTO SEPARATE CELLS

TECHNICAL FIELD

This invention relates to a process of using scribing and ink jet printing techniques for forming separate electrical cells and interconnecting them in series to manufacture various thin film devices. In particular, it describes a novel method for forming the cells and series interconnecting structures in a single step process in solar panels that have continuous layers of bottom electrode material, semi-conductor material and top electrode material. It is particularly appropriate for solar panels formed on flexible substrates as the single step process eliminates the problems associated with sequential layer to layer scribe alignment. The method is also appropriate for the manufacture of other thin film devices such as lighting panels and batteries. The invention also relates to apparatus for carrying out the method described.

BACKGROUND ART

The usual way to form and interconnect cells in thin film solar panels involves sequential layer coating and laser scribing processes. To complete the structure three separate coating processes and three separate laser processes are usually required. It is usual to perform these processes in a six step sequence consisting of a laser step following each coating step as described below:—
  a) Deposit a thin layer of the lower electrode material over the whole substrate surface. The substrate is usually glass but can also be a polymer sheet. This lower layer is often a transparent conducting oxide such as tin oxide (SnO2), zinc oxide (ZnO) or indium tin oxide (ITO). Sometimes it is an opaque metal such as molybdenum (Mo).
  b) Laser scribe parallel lines across the panel surface at typically 5-10 mm intervals right through the lower electrode layer to separate the continuous film into electrically isolated cell regions.
  c) Deposit the active electricity generating layer over the whole substrate area. This layer might consist of a single amorphous silicon layer or a double layer of amorphous silicon and micro-crystalline silicon. Layers of other semiconducting materials such as cadmium telluride and cadmium sulphide (CdTe/CdS) and copper indium gallium di-selenide (CIGS) are also used.
  d) Laser scribe lines through this active layer or layers parallel to and as close as possible to the initial scribes in the first electrode layer without damaging the lower electrode material
  e) Deposit a third, top electrode layer, often a metal such as aluminium or a transparent conductor such as ZnO, over the whole panel area.
  f) Laser scribe lines in this third layer as close to and parallel to the other lines to break the electrical continuity of the top electrode layer.

This procedure of deposition followed by laser isolation breaks up the panel into a multiplicity of separate long, narrow cells and causes an electrical series connection to be made between all the cells in the panel. In this way the voltage generated by the whole panel is given by the product of the potential formed within each cell and the number of cells. Panels are divided up into typically 50-100 cells so that overall panel output voltage is typically in the 50 to 100 Volt range. Each cell is typically 5-15 mm wide and around 1000 mm long. A thorough description of the processes used in this multi-step solar panel manufacturing method is given in JP10209475.

Schemes have been devised to simplify this multi step process of, making solar panels by combining some of the separate layer coating steps. This reduces the number of times the substrate has to be moved from a vacuum to an atmospheric environment and hence is likely to lead to improved layer quality and increased solar panel efficiency. U.S. Pat. No. 6,919,530, U.S. Pat. No. 6,310,281 and US2003/0213974A1 all describe methods for making solar panels where two of the 3 required layers are coated before laser scribing is performed. The lower electrode layer and the active layer (or layers) are deposited sequentially and then both layers are laser scribed together to form a groove that is then filled with an insulating material. For U.S. Pat. No. 6,310,281 and US2003/0213974A1 it is proposed that this groove filling be performed by ink jet printing. Following the groove filling, the interconnection procedure is as described above with a laser scribe through the active layer, deposition of the top electrode layer and a final scribe of the top electrode layer to isolate the cells.

A scheme has also been proposed where all three layers are coated before any laser scribing is performed. WO 2007/044555 A2 describes a method for making a solar panel where the complete three layer stack is coated in one process sequence following which laser scribes are made into and through the stack. The laser scribe process is complex as it consists of a single scribe with two different depths. On a first side of the scribe the laser penetrates the complete three layer stack right through to the substrate in order to electrically separate the lower electrode layer to define the cells while on the second side of the scribe the laser only penetrates through the top and active layers to leave a region where a ledge of lower electrode layer material is exposed. Insulating material is applied locally to the first side of the scribe that penetrates to the substrate so that the insulating material covers the edge of the lower electrode layer and the edge of the active layer on the first side of the scribe. Following this, conducting material is deposited into the scribe so that it bridges the insulating material previously applied and connects the top electrode layer on the first side to the ledge of lower electrode material on the second side.

The process described in WO2007/044555A2 is complex and requires careful control. Debris generated during the second stage of the dual level laser scribe process is likely to deposit on the adjacent top surface of the ledge of lower electrode material leading to poor electrical connection. A high level of control is needed to ensure that the insulating material is placed in exactly the right position on the first side of the scribe and no material is deposited on top of the ledge of lower electrode material. Extreme accuracy is needed to ensure that the conducting material is placed correctly and does not contact the top electrode on the second side of the scribe. For all these reasons it is unlikely that cell connections can be made with high reliability by this method.

Hence, there remains a requirement for a new cell formation and interconnection process for solar panels and the like that starts with the full stack of three layers but proceeds to make the cell interconnections in a way that is fast, simple and reliable.

Such a process will also be applicable to the formation and series interconnection of cells for the manufacture of other thin film devices such as lighting panels or batteries. Like solar panels, such devices consist of a lower electrode layer, an active layer and a top electrode layer all deposited on a rigid or flexible substrate. Operation at voltages higher than the fundamental single cell voltage can be achieved by dividing the device into multiple cells and connecting the cells in series. The laser and ink jet cell formation and interconnection apparatus proposed here is suitable for such an operation.

For lighting panels, the upper and lower electrodes are likely to be of similar materials to those used for solar panels (eg TCOs or metals) but the active materials are very different. In this case, active layers are most likely to be organic materials but inorganic materials are also possible. Active organic layers are either based on low molecular weight materials (so called OLEDs) or high molecular weight polymers (so called P-OLEDs). Hole and electron transport layers are usually associated with the active light emitting layers. For these lighting panels, operation is at low voltage and all layers are thin and hence the interconnection process described herein is ideal for dividing the panel into cells and connecting these in series to allow operation at a substantially higher voltage For thin film batteries the layers are often more complex. For the case of a thin film battery based on Lithium ion technology, the lower layer has two components—a metal layer for current collection and a Lithium Cobalt Oxide (LiCoO3) layer that functions as a cathode. The upper layer also has two components—a metal layer for current collection and a Tin Nitride (Sn3N4) layer that functions as an anode. In between these two layers is the active layer—a Lithium Phosphorous OxyNitride (LiPON) electrolyte. For such batteries, operation is at low voltage and all layers are thin and hence the interconnection process described herein is ideal for dividing the battery into cells and connecting these in series to allow operation at a substantially higher voltage

SUMMARY OF THE INVENTION

According to a first aspect of the invention, there is provided a method for dividing a thin film device having a first layer which is a lower electrode layer, a second layer which is an active layer and a third layer which is an upper electrode layer, all the layers being continuous over the device, into separate cells which are electrically interconnected in series, the dividing of the cells and the electrical connection between adjacent cells all being carried out in a single pass of a process head across the device, the process head performing the following steps in the single pass:
 a. making a first cut though the first, second and third layers;
 b. making a second cut though the second and third layers, the second cut being adjacent to the first cut;
 c. making a third cut through the third layer, the third cut being adjacent to the second cut and on the opposite side of the second cut to the first cut;
 d. using a first ink jet print head to deposit a non-conducting material into the first cut; and
 e. using a second ink jet print head to apply conducting material to bridge the non-conducting material in the first cut and either fully or partially fill the second cut such that an electrical connection is made between the first layer and the third layer,
 wherein step (a) precedes step (d), step (d) precedes step (e) and step (b) precedes step (e), otherwise the steps may be carried out in any order in the single pass of the process head across the device.

According to a second aspect of the invention, there is provided apparatus for dividing a thin film device having a first layer which is a lower electrode layer, a second layer which is an active layer and a third layer which is an upper electrode layer, all the layers being continuous over the device, into separate cells which are electrically interconnected in series, the apparatus comprising a process head on which are provided:
 a. one or more cutter units for making a first cut though the first, second and third layers and a second cut though the second and third layers' adjacent to the first cut and a third cut through the third layer adjacent to the second cut;
 b. a first ink jet print head for depositing a non-conducting material into the first cut; and
 c. a second ink jet print head for applying conducting material to bridge the non-conducting material in the first cut and either fully or partially fill the second cut so that an electrical connection is made between the first layer and the third layer, the apparatus also comprising:
 d. drive means for moving the process head relative to the panel; and
 e. control means for controlling movement of the process head relative to the device and actuating said one or more cutter units and said first and second ink jet print heads so that division of the panel into separate cells and the formation of an electrical connection between adjacent cells can all be carried out in a single pass of the process head across the device.

In the detailed description of the invention that follows the cutter units that are used to form the cuts through the various layers are all based on lasers, the beams from which are focussed to ablate and remove material to form the isolating cuts. This is the preferred method for forming the cuts but other methods of cutting may also be used. One alternative method for forming cuts is mechanical scribing with fine wires or styli. Such mechanical scribing can be used instead of laser cutting for forming all or some of the first, second or third cuts.

Like the invention described in WO 2007/044555 A2, this invention involves the processing of a thin film device having a complete stack of three layers but subsequent layer cutting and ink jet processing is less complex and much more robust compared to that described in WO 2007/044555 A2. As in WO2007/044555 A2, all three coatings are applied sequentially before any layer cutting or material deposition by ink jetting. Ideally, these coatings might be applied in a single vacuum process but this is not essential. The key point of our invention is that following the deposition of the coatings a single combined layer cutting and ink jet process is used to make the cell inter-connections. A "single combined process" should be understood to mean that all the cutting processes and all the associated ink jet based material deposition processes are performed by means of the movement of a process head in a single pass across all or part of the solar panel in a plane parallel to the substrate surface and in a direction parallel to the boundary between the cells. All cutter units and all ink jet print heads required to make one or more cell interconnections are attached to a single process head and hence all items move together at the same speed across the panel.

The sequence in which the various layer cutting processes and the various ink jet deposition processes are applied to the substrate can vary depending on the materials used. The various layer cutter units and ink jet print heads are attached to the process head in such positions that the correct sequence is achieved as the process head moves with respect to the substrate.

For simplicity of illustration, the layer cutting processes will henceforth be described with reference to laser ablation. It should be noted, however, that all or some of these laser cutting processes may be replaced by a mechanical scribing process (or other cutting process).

To form a single cell interconnection structure between adjacent first and second cells, three adjacent laser beams, delivered by three adjacent beam delivery units attached to the process head move together with respect to the substrate in the direction parallel to the boundary between the cells to make three parallel adjacent scribes to different depths in the various layers. A first laser beam makes a first scribe line that defines the edge of the first cell. This first scribe penetrates all layers down to the substrate. A second laser beam located on the second cell side of the first scribe makes a second scribe line that penetrates through all layers except the lower electrode layer. A third laser beam situated on the second cell side of the second scribe makes a third scribe that penetrates the upper electrode layer. This third scribe defines the extent of the second cell. The precise order in which these three laser processes is performed is not critical but preferred orders are discussed below.

A first ink jet printing process follows some or all of the laser processes. For this first printing process a first ink jet head moves across the substrate surface with at least one nozzle arranged to print a fine line of insulating ink that fills the first laser scribe. This ink can be of the thermally curing type in which case heat is applied locally to the deposited liquid immediately after deposition to cure the insulating ink to make an insulating solid line of material that fills the first scribe. Alternatively following all laser and ink jet processes heat is applied to the whole of the substrate to cure the lines of insulating ink to make insulating solid lines of material that fill all the first scribes on the substrate. This whole substrate curing process can take place on the same apparatus that performs the laser scribing and ink deposition processes but in practice it is more likely that this curing is performed on separate apparatus.

The insulating ink can also be of the UV curing type. In this case curing is performed by means of a UV lamp or other appropriate UV light source in which case UV radiation is applied locally to the deposited liquid immediately after deposition to cure the insulating ink to make an insulating solid line of material that fills the first scribe. The depth of the insulating layer in the scribe is a small as possible consistent with being continuous and having no pinholes. The width of the line of insulating material is such that it fully contacts the lower two exposed layers on the first cell side of the first scribe so that these layers are protected from material subsequently applied in a second ink jet printing process. Some degree of insulating ink overfilling on both sides of the first scribe is allowed and may even be desirable but ideally the lateral extent of the over filling should be kept to a value that is less than the width of the first scribe.

The second ink jet printing process takes place following some or all of the laser processes and following the first ink jet printing process. For this second ink jet printing process a second ink jet head is moved over the substrate surface with at least one nozzle arranged to print a band of conducting ink that is wide enough to make electrical contact with the top electrode material on the first cell side of the first laser scribe, to straddle the insulating ink material in the first scribe and enter the second scribe to make electrical contact the lower electrode layer material of the second cell. The insulating ink in the first scribe may be either cured or uncured at the time of application of the conducting ink. If the insulating ink is uncured then the composition of the conducting ink is such that the solvent does not significantly perturb or dissolve the uncured insulating ink material. The conducting ink is likely to be of the thermally curing type, in which case, following all laser and ink jet processes, heat is applied to the whole substrate to cure the bands of conducting ink to form solid conducting bands of material. In this way electrically conducting bridges are formed that connect the top electrode in one cell to the lower electrode layer in the next cell. The depth of the conducting layer is a small as possible consistent with being robust and having adequately low electrical resistance. The width of the line of conducting material is such that it fully contacts a region of the first cell top electrode material on the first cell side of the first scribe and fully fills the second scribe. Some degree of conducting ink overfilling on the first cell side of the first scribe and the second cell side of the second scribe is allowed and may even be desirable but ideally the lateral extent of the over filling should be kept to a value less than the scribe width.

Because three separated laser scribes are used it is possible to individually optimize the laser process parameters for each scribe to eliminate the possibility of substrate or lower layer damage, reduce risk of forming electrical shorts between layers and minimize debris deposition.

It is also possible to attach the individual beam delivery heads to the process head in positions spaced along the direction of movement of the head with respect to each other so the positions of the ink jet heads defines the sequence in which processes are applied to the substrate. A preferred sequence for the 5 processes is:— a. First laser scribe through all layers down to the substrate surface to define the extent of the first cell
  b. First ink jet process to deposit insulating ink in the first laser scribe
  c. Second laser scribe process through the top two layers down to the lower electrode layer
  d. Second ink jet process to apply a band of conducting ink over the insulating ink to form a conducting bridge from the top electrode on the first cell side to the lower electrode on the second cell side
  e. Third laser scribe process through the top electrode layer to isolate the first and second cells and define the extent of the second cell With this sequence of laser and ink jet processes, lower layers in the stack remain protected from laser ablation debris and stray ink materials arising from earlier processes until just before exposure and the total cell interconnection process becomes very robust.

For example, some debris generated by the first laser process and some insulating ink deposited by the first printing process may form on the substrate surface in the region where the second laser process scribes through to expose the lower electrode. If the second laser process precedes the first ink jet printing process, or the first laser process, then any stray debris or insulating ink may enter the second laser scribe region and contaminate the exposed lower electrode layer. Leaving the second laser process until after both the first laser and first ink jet printing processes means that the lower electrode layer in the area of the second laser scribe remains protected and during the second laser process any re-deposited debris and any insulating ink in that area is removed as the laser ablates the top two layers.

As another example, debris generated by the second laser process and some conducting ink deposited by the second printing process may form on the substrate surface in the region where the third laser process scribes through to separate the top electrode layer. If the third laser process precedes the second printing or the second or even first laser processes then any stray debris or ink may deposit on the top surface of the second cell in the third laser scribe region and may cause an electrical connection across the scribe region. Leaving the third laser scribe process until after both the first and second laser processes and after both the first and second printing processes means that this source of interconnect failure is eliminated.

The preferred process sequence given above is appropriate if the components of the process head are to be operated as the head moves in only one direction across the panel (the components being inoperative as the head returns to its initial position). If, however, the components of the head are to be operative as the process head is moved in either (or both) directions over the panel, then an alternative sequence is preferred. This sequence for the 5 processes is:— a. First laser scribe through all layers down to the substrate surface to define the extent of the first cell
b. Second laser scribe process through the top two layers down to the lower electrode layer
c. Third laser scribe process through the top electrode layer to isolate the first and second cells and define the extent of the second cell
d. First ink jet process to deposit insulating ink in the first laser scribe
e. Second ink jet process to apply a band of conducting ink over the insulating ink to form a conducting bridge from the top electrode on the first cell side to the lower electrode on the second cell side With this sequence, by mounting two ink jet heads for delivery of insulating ink and two ink jet heads for delivery of conducting ink on a single process head, the head can be operated in either direction of travel. In this case, the order in which the separate laser and ink jet heads are mounted on the head is as follows:— a. first conducting ink jet head
b. first insulating ink jet head
c. first, second and third laser beams
d. second insulating ink jet head
e. second conducting ink jet head.

When the process head moves in one direction all three laser beams are operated but only the first insulating and first conducting ink jet heads are operated so that the process sequence is c, b and a. When the process head moves in the opposite direction all three laser beams are operated but in this case the first ink jet heads are inactive and the second ink jet heads are activated so that the process sequence is c, d and e.

Some processes have to precede others:—
1) The first laser scribe process must always precede the first printing process
2) The first printing process must always precede the second printing process
3) The second laser scribe process must always precede the second printing process.

Within these rules several different process sequences are possible but the one given above is preferred. It is also preferred that curing of lines of both insulating and conducting inks is performed thermally and that this thermal curing process is carried out simultaneously to all the lines of insulating ink and conducting ink on the substrate using separate apparatus to that used to carry out the laser and ink jet deposition processes.

The lasers used to create the first, second and third cuts are generally of the pulsed Q-switched type operating in the IR to UV range (ie with wavelengths from 1080 nm down to 340 nm). In the simplest case, a single laser is used with a single focussing lens to create all three cuts associated with a single interconnect structure. Hence, in this case, it is necessary to divide the single beam into three components to form three focal spots on the substrate surface. Cut separation in an interconnect is generally small (in the 0.1 to 0.2 mm range) so a preferred way to make the three-way beam division is to use a diffractive optical element (DOE) or special multi-facetted prismatic element positioned before a single focussing lens. Such devices introduce small angular deviations to parts of the laser beam which give rise to focal spot separations of the required value at the focus of the lens. Such devices also allow the relative power in individual beams to be set by suitable device design.

Another preferred method to create the first, second and third beams associated with a single interconnect structure involves the use of two different pulsed lasers and a single focussing lens. In this case, the lasers can have different wavelengths which is often advantageous in terms of optimised removal of upper layers without damaging lower layers of material. When two lasers are used to form the three beams required for a single interconnect structure, a first laser is used to form two of the beams and the second laser the third beam. A DOE or simple biprism is used to divide the first beam into two components in the same way as discussed above for the case where only a single laser is used and the beam is divided into three components. The beam from the second laser is combined with the beams created from the first laser and all beams are passed through a single focussing lens to create three spots with the required separation on the substrate surface. Beam combining with a special mirror that transmits one beam and reflects another using polarisation or wavelength differences between first and second lasers is commonly used.

Servo motor driven stages are used to move the substrate with respect to the process head. In operation, the process head can be stationary with the panel moving in two axes in a series of linear moves in the direction parallel to the cell directions each pass across the substrate being followed by a step in the orthogonal direction. The process head may process a single cell interconnect on each pass or in a preferred situation may process multiple interconnects on each pass. Other stage arrangements are possible. A preferred arrangement has the substrate moving in one axis and the process head moving in the other. An arrangement where the process head moves in two orthogonal axes over a stationary substrate is also possible.

Other preferred and optional features of the invention will be apparent from the subsidiary claims of the specification.

BRIEF DESCRIPTION OF DRAWINGS

The invention will now be described, merely by way of example, with reference to the accompanying drawings, in which.

For simplicity, the figures illustrate layer cutting processes as being of the laser ablation type. It should be noted, however, that all or some of these laser cutting processes may be readily replaced by a mechanical scribing process or other cutting process.

DETAILED DESCRIPTION OF DRAWINGS

Figure 1:
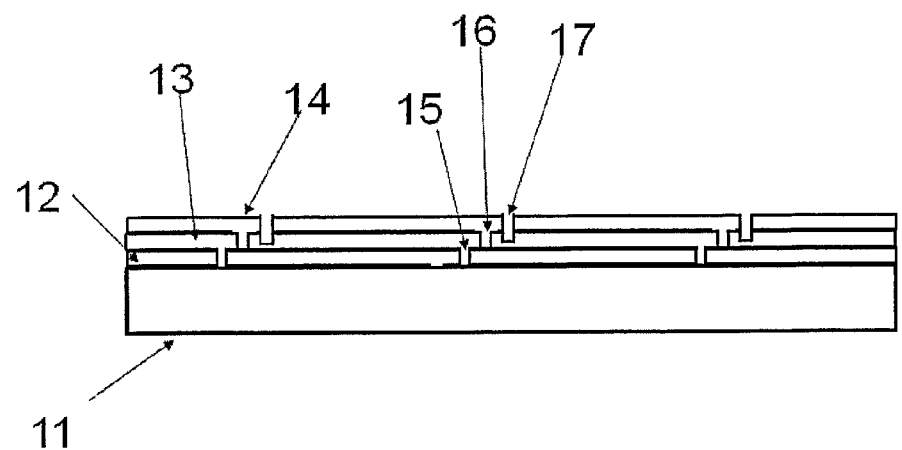
FIG. 1 shows a standard method for electrically interconnecting cells in a thin film solar panel.

FIG. 1 is prior art and shows a section of a solar panel that has been subdivided into separate cells which have been electrically connected in series by means of the three layer coating and three laser scribing processes. The substrate 11 has three layers: a lower electrode layer 12, an active layer 13 and a top electrode layer 14. Laser scribes 15, 16 and 17 permit electrical connections and isolations between adjacent cells to be formed.

Figure 2:
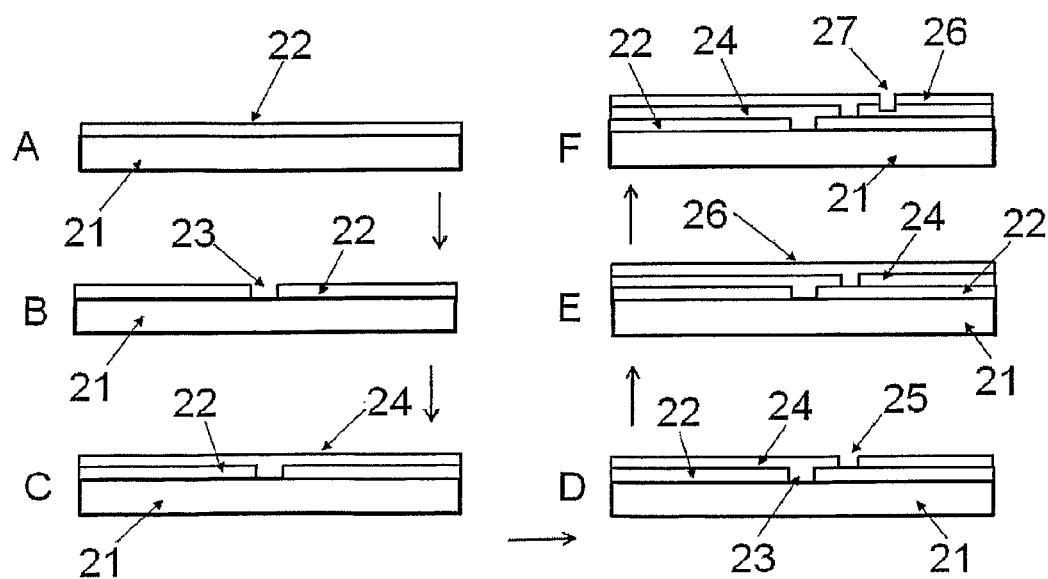
FIGS. 2A to 2F illustrate a standard method using separate laser scribing and material deposition steps to form and interconnect cells in the case where only the lower electrode layer has been applied before laser scribing commences. This sequence of processes is a standard, known solar panel production method.

FIG. 2 is prior art and shows a region of a solar panel in the neighbourhood of the boundary between two adjacent cells. FIGS. 2A to 2F show the various coating ° and laser scribing stages that are used to form and connect the cells. The substrate 21 is generally glass or plastic but can also be made of another insulating material. It can also be metal or a metal with an insulating coating. In FIG. 2A the lower electrode layer 22 has been applied to the substrate 21. FIG. 2B shows how a first laser scribe line 23 through the lower electrode layer 22 to the substrate 21 defines the cell boundary. In FIG. 2C an active layer 24 is applied to the substrate filling the first laser scribe line. FIG. 2D shows how a second laser scribe line 25 parallel to the first line 23 separates the active layer 24. In FIG. 2E a top electrode layer 26 is applied to the substrate filling the second laser scribe line 25. FIG. 2F shows the final stage where a third laser scribe line 27 parallel to the second line 25 completely penetrates the top electrode layer 26 and partially or fully penetrates the active layer 24.

Figure 3:
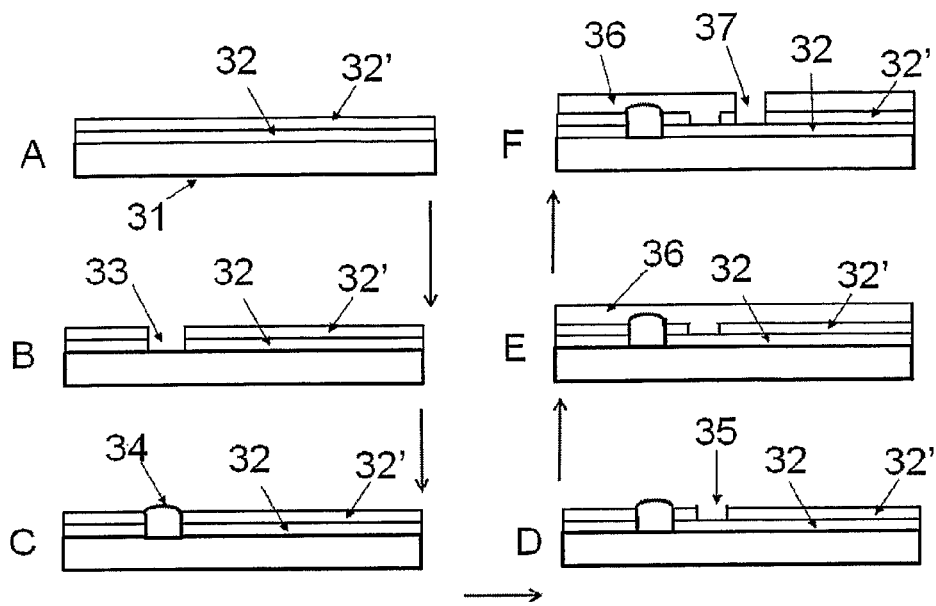
FIGS. 3A to 3F illustrate a standard method using separate laser scribing and material deposition steps to form and interconnect cells in the case where the lower electrode layer and the active layer have both been applied before laser scribing commences. This sequence of processes is also known.

FIG. 3 is prior art showing an example of a case where both the lower electrode layer and the active layer are applied before cell interconnection proceeds. FIG. 3A shows the substrate 31 with two coating layers 32 and 32' applied. FIG. 3B shows a first laser scribe line 33 penetrating the two layers 32, 32' as far as the substrate. FIG. 3C shows how an insulating fluid 34 is applied into the first laser cut 33. One method for doing this is to use an ink jet nozzle. The fluid 34 is subsequently cured to form a solid. FIG. 3D shows how a second laser scribe line 35 penetrates the upper 32' of the two layers only. FIG. 3E shows how a top electrode layer 36 is applied so filling the second laser scribe line 35. FIG. 3F shows the final stage where a third laser scribe line 37 completely penetrates the top electrode layer 36 and partially or fully, penetrates the active layer 32'.

Figure 4:
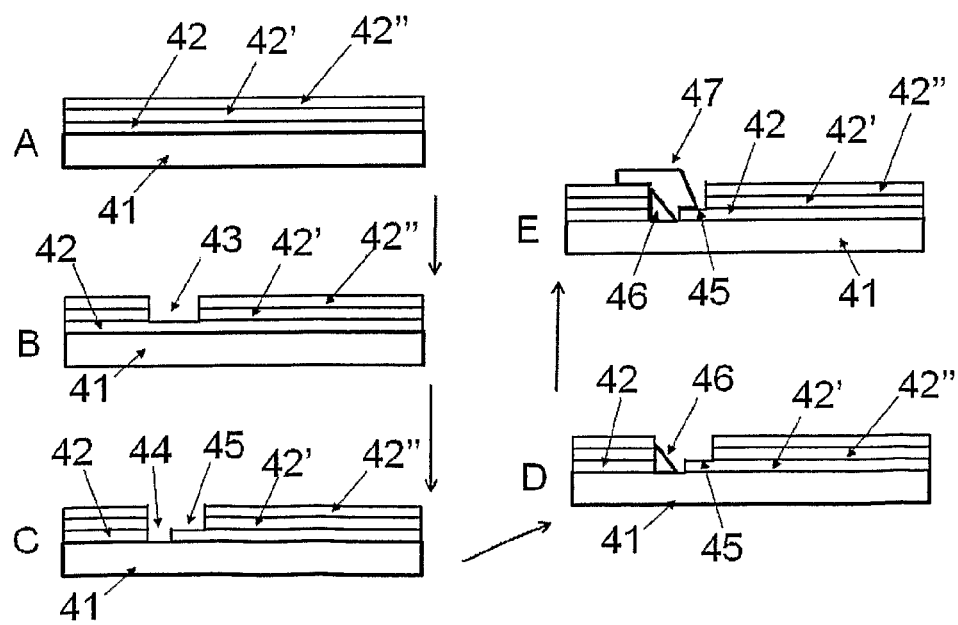
FIGS. 4A to 4E illustrate a standard method using separate laser scribing and material deposition steps to interconnect cells in the case where the lower electrode layer, the active layer and the upper electrode layer have all been applied before laser scribing commences; This sequence of processes is also known.

FIG. 4 is prior art showing an example of a case where all three layers; the lower electrode layer, the active layer and the top electrode layer are applied before cell interconnection proceeds. FIG. 4A shows the substrate 41 with a stack of layers consisting of a lower electrode layer 42, an active layer 42' and an upper electrode layer 42". These layers are applied sequentially without any intermediate laser processes. FIG. 4B shows a first wide laser scribe line 43. This scribe line 43 penetrates only the top two layers 42', 42" of the layer stack and leaves the lower electrode layer 42 intact. FIG. 4C shows how a second narrower laser scribe line 44 is made inside and to one side of the first scribe line 43. This second scribe line 44 penetrates the lower electrode layer 42 and leaves a ledge 45 of lower electrode material 42 remaining. FIG. 4D indicates how an insulating fluid 46 is applied into the first laser scribe 43 by means of an ink jet nozzle. The fluid 46 is subsequently cured to form a solid. The application of the fluid into the scribe 43 is carefully controlled so that it is applied only to a first side of the scribe line 43 that side being the side that penetrates to the substrate and is opposite to the side where the ledge 45 of lower electrode material 42 exists. FIG. 4E shows the final stage where conducting fluid 47 is deposited into the scribe line so that it bridges the insulating material 46 and makes an electrical connection between the top electrode layer 42" on the first side of the scribe 43 to the ledge 45 of lower electrode material on the second side of the scribe 43. Care has to be taken to ensure that the conducting material 47 does not contact the top electrode 42" on the second side of the scribe 43.

Figure 5:
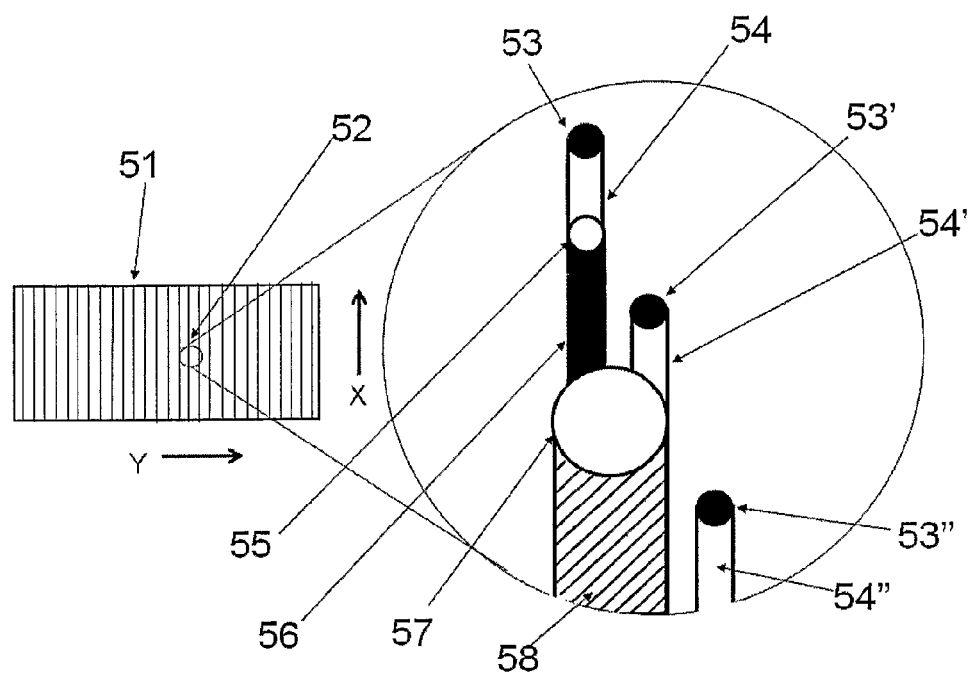
FIG. 5 shows an enlarged, schematic, plan view of part of apparatus according to a first embodiment of the invention. It shows an arrangement of the three laser beams and two ink jet nozzles that are attached to a process head in order to make a single cell interconnect structure.

FIG. 5 shows a first, preferred, version of part of the apparatus according to the invention. It shows a first arrangement of the three laser beams and two ink jet nozzles that are attached to a process head in order to make a single cell interconnect structure. A solar panel 51 has multiple cells along its length in the direction Y. This means that interconnections are made by relative motion of the process head with respect to the panel in the direction X. An area of the panel 52 that includes a region where adjacent cells are connected is shown enlarged on the right side of the figure and shows part of the moving process head with its associated laser beams and ink jet nozzles that correspond to a single cell interconnect structure. First, second and third laser beams 53, 53' and 53" make a first scribe 54 through all three layers, a second scribe 54' through the top two layers and a third scribe 54" through the top layer, respectively. The figure indicates the process head and attached laser beams moving in the X direction with respect to the substrate such that, on the substrate surface, the first laser beam 53 is in advance of the second laser beam 53' which is likewise in advance of the third laser beam 53". An ink jet nozzle 55 is attached to the process head and is situated on a line that is parallel to the X direction and passes through the position of the first laser beam 53. This nozzle 55 injects a stream of insulating fluid 56 to fill the first laser scribe line 54. A second, larger ink jet nozzle 57, or multiple smaller nozzles, is also attached to the process head and is situated in the X direction such that when the process head is moving over the substrate, the second ink jet nozzle 57 follows the first ink jet head 55 and the second laser beam 53'. This second ink jet nozzle 57 injects a stream of conducting fluid 58. The nozzle is situated in the Y direction such that the fluid 58 is deposited on the substrate surface and forms an electrically conducting bridge over the previously applied insulating fluid 56, the bridge extending from the upper electrode surface on the left side of the first scribe 54 to the lower electrode surface at the base of the second scribe 54'. As the process head moves across the substrate in the X direction, the order of the five processes carried out to form and complete the interconnect structure is as follows:—

1) Laser scribe line 54 through all 3 layers by first laser beam 53
2) Fill first laser scribe line 54 with insulating ink 56 delivered by first ink jet nozzle 55
3) Laser scribe line 54' through top 2 layers by second laser beam 53'
4) Form conducting bridge across first laser scribe line 54 to second laser scribe line 54' with conducting ink 58 delivered by second ink jet nozzle 57
5) Laser scribe line 54" through top layer by third laser beam 53"

Instead of moving the process head over a stationary substrate surface in the direction X (as shown), the same sequence of laser and ink jet processes can be achieved by holding the process head stationary and moving the panel in the opposite X direction.

Figure 6:
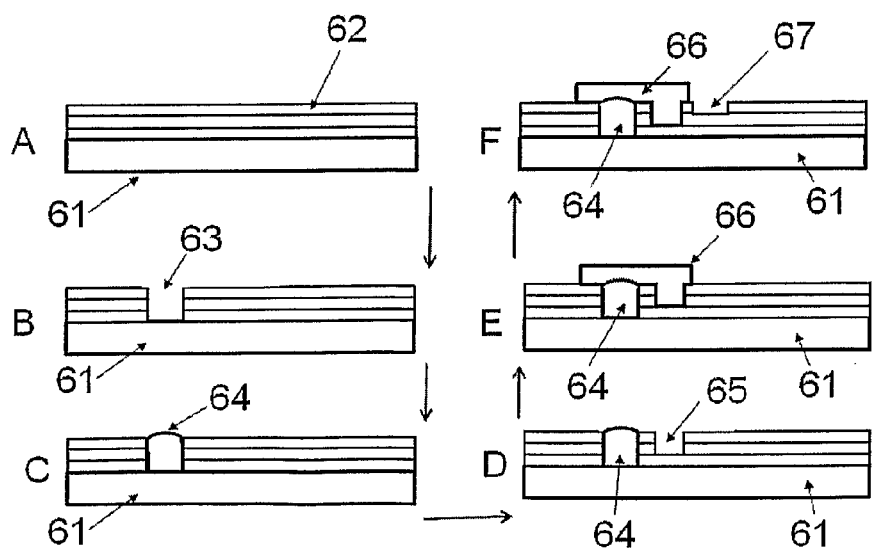
FIGS. 6A to 6F show a preferred sequence of laser and ink jet processes delivered to a substrate surface by the apparatus shown in FIG. 5.

FIG. 6 shows the sequence of the laser and ink jet processes delivered to the substrate surface by the apparatus shown in FIG. 5. FIG. 6A shows a substrate 61 on which a stack of layers 62 consisting of a lower electrode layer, an active layer and an upper electrode layer has been deposited. These layers are applied sequentially without any intermediate laser processes. FIG. 6B shows the first of the three laser processes that are then carried out. A first laser scribe line 63 is made that penetrates all 3 layers 62 as far as the substrate 61. After the first laser process has been completed, insulating material is immediately applied by ink jet printing into the first laser scribe line 63. FIG. 6C shows how an insulating fluid 64 is applied into the first laser scribe line 63 by means of a first ink jet nozzle (not shown). The fluid 64 is immediately UV cured or later thermally cured to form a solid FIG. 6D shows the next step where a second laser scribe line 65 is made parallel to the first scribe line 63 through the top two layers as far as the lower electrode layer. FIG. 6E shows the next step where fluid 66 that is conducting or contains conducting particles is applied by means of a second ink jet nozzle (not shown) over the insulating material 64 in the first scribe line 63 and also into the second laser scribe line 65. The fluid 66 is subsequently thermally cured to form a solid. The conducting material 66 forms a bridge over the insulating material 64 to electrically connect the top electrode layer on the left side to the bottom electrode layer on the right side to connect adjacent cells in series. FIG. 6F shows the last step in the interconnection process where a third laser scribe line 67 that penetrates the upper layer is made parallel to and beside the second scribe line 65 on the side away from the first scribe line 63. This scribe can also penetrate partially or fully into the active layer but must not damage the lower electrode layer. The advantages of the preferred sequence of processes shown in FIGS. 5 and 6 are:—

Figure 7:
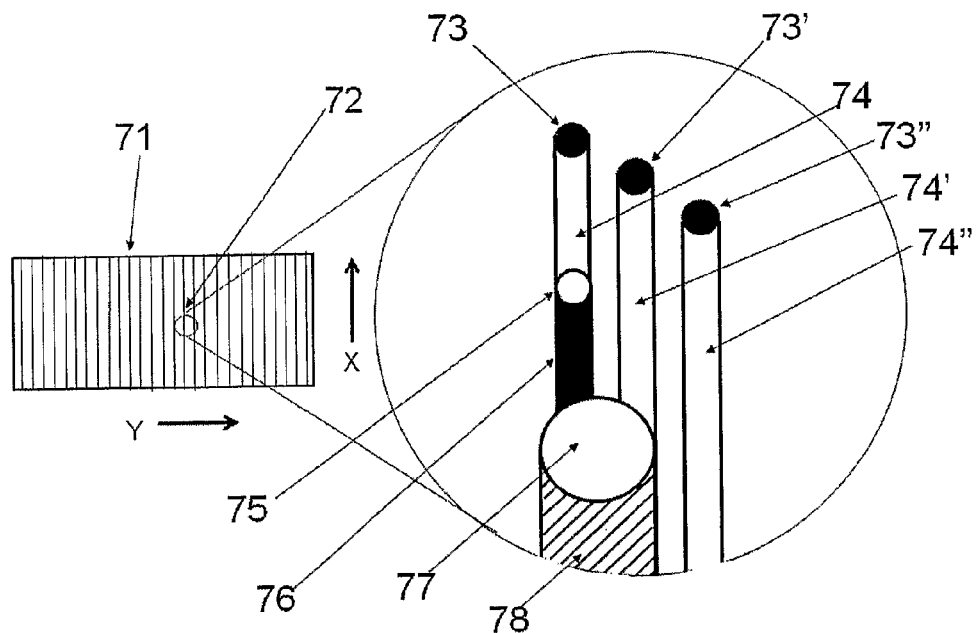
FIG. 7 shows an enlarged, schematic, plan view of part of apparatus according to a second embodiment of the invention.

1) the second laser scribe process can be used to remove any debris generated by the first laser scribe process that deposits in the region of the second scribe line as well as deposited insulating ink that may have spread across the surface of the upper electrode into the region of the second scribe line, and
2) the third laser scribe process can be used to remove any debris generated by the second laser scribe process that deposits in the region of the third scribe line as well as deposited conducting ink that may have spread across the surface of the upper electrode into the region of the third scribe line FIG. 7 shows a second version of part of apparatus according to a second embodiment of the invention. It shows a second arrangement of the three laser beams and two ink jet nozzles that are attached to the process head in order to make a single cell interconnect structure. A solar panel 71 has multiple cells along its length in direction Y. This means that interconnections are made by moving the process head with respect to the panel in the X direction. An area 72 of the panel that includes a region where adjacent cells are connected is shown enlarged on the right side of the figure and shows part of the moving process head with its associated laser beams and ink jet nozzles that correspond to a single cell interconnect structure. First, second and third laser beams 73, 73' and 73" make a first scribe 74 through all three layers, a second scribe 74' through the top two layers and a third scribe 74" through the top layer, respectively. The figure shows the process head and attached laser beams moving in the X direction such that on the substrate surface the first laser beam 73 is in advance of the second 73' which is likewise in advance of the third 73". Other ordering of these three beams is possible or all three can be in a line moving across the substrate surface. An ink jet nozzle 75 is attached to the process head and is situated on a line that is parallel to the X direction and passes through the position of the first laser beam 73. This nozzle 75 injects a stream of insulating fluid 76 to fill the first laser scribe 74. A second larger ink jet nozzle 77, or multiple smaller nozzles, is also attached to the process head and is situated in the X direction such that when the process head is moving over the substrate the second ink jet head 77 follows the first ink jet head 75. This second ink jet nozzle 77 injects a stream of conducting fluid 78. The nozzle 77 is situated in the Y direction such that the fluid 78 is deposited on the substrate surface and forms an electrically conducting bridge over the previously applied insulating fluid 76, the bridge extending from the upper electrode surface on the left side of the first scribe 74 to the lower electrode surface at the base of the second scribe 74'. As the process head moves across the substrate in the X direction, the order of the five processes carried out to form and complete the interconnect structure is as follows:—

1) Carry out 3 laser scribes with first, second and third laser beams 73, 73', 73"
2) Fill first laser scribe line 74 with insulating ink 76 delivered by first ink jet nozzle 75
3) Form conducting bridge across first laser scribe line 74 to second laser scribe line 74' with conducting ink 78 delivered by second ink jet nozzle 77.

Instead of moving the process head over the stationary substrate surface in the direction X as shown the same sequence of laser and ink jet processes is achieved by holding the process head stationary and moving the panel in the opposite X direction.

Figure 8:
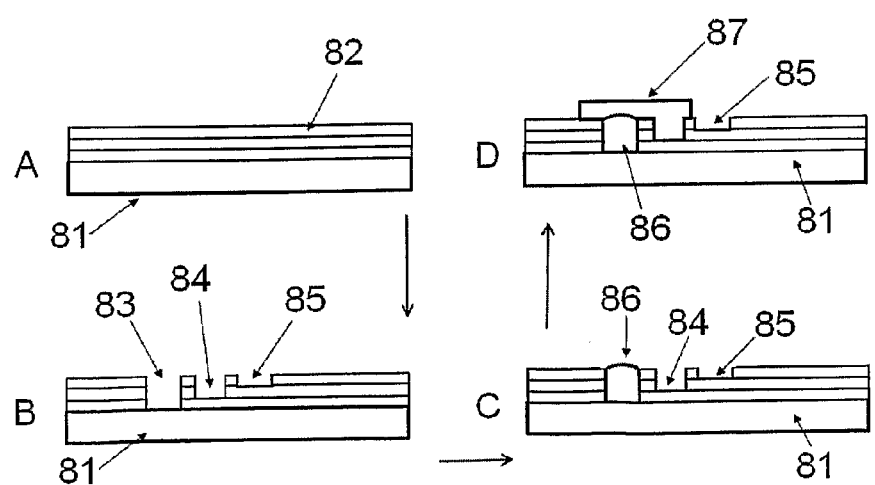
FIGS. 8A to 8D show a preferred sequence of laser and ink jet processes delivered to a substrate surface by the apparatus shown in FIG. 7.

FIG. 8 shows the time sequence of the laser and ink jet processes delivered to the substrate surface by the apparatus shown in FIG. 7. FIG. 8A shows a substrate 81 on which a stack of layers 82 consisting of a lower electrode layer, an active layer and an upper electrode layer has been deposited. These layers are applied sequentially without any intermediate laser processes. FIG. 8B shows the three laser processes that are then carried out. A first laser scribe 83 is made that penetrates all 3 layers as far as the substrate. A second laser scribe 84 penetrates the top two layers but not the lower electrode layer. A third laser scribe 85 penetrates the top electrode layer and may also penetrate into the active layer. These three laser scribes can be performed at exactly the same time or they can be carried out sequentially. The order in which they are made is not critical. After all three laser processes have been completed materials are applied by ink jet printing. FIG. 8C shows how an insulating fluid 86 is applied into the first laser scribe 83 by means of an ink jet nozzle (not shown). The fluid 86 is immediately UV cured or later thermally cured to form a solid. FIG. 8D shows the next step where a fluid 87 that is conducting or contains conducting particles is applied by means of an ink jet nozzle (not shown) over the insulating material 86 in the first scribe 83 and also into the second laser scribe 84. The fluid 87 is subsequently thermally cured to form a solid. The fluid 87 does not extend into the third scribe 85. The conducting material 87 forms a bridge over the insulating material 86 to electrically connect the top electrode layer on the left side to the bottom electrode layer on the right side to connect adjacent cells in series.

Figure 9:
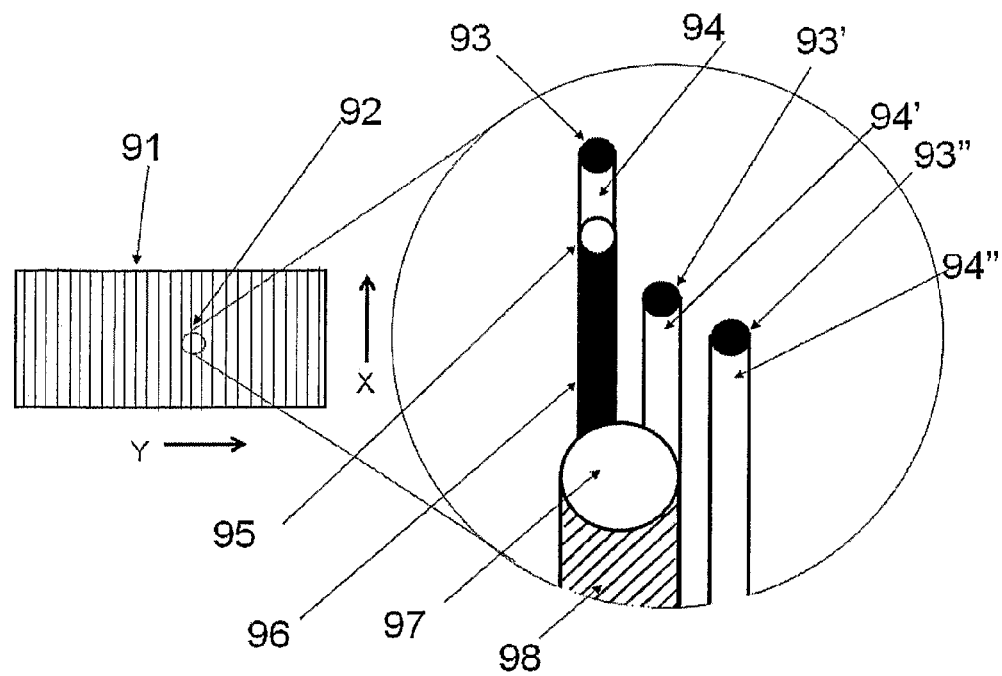
FIG. 9 shows an enlarged, schematic, plan view of apparatus according to a third embodiment of the invention.

FIG. 9 shows a third version of part of apparatus according to a third embodiment of the invention. It shows a third arrangement of the three laser beams and two ink jet nozzles that are attached to the process head in order to make a single cell interconnect structure. A solar panel 91 has multiple cells along its length in direction Y. This means that interconnections are made by moving the panel 91 with respect to the process head in the X direction. An area 92 of the panel that includes a region where adjacent cells are connected is shown expanded on the right side of the figure and shows part of the moving process head with its associated laser beams and ink jet nozzles that correspond to a single cell interconnect structure. First, second and third laser beams 93, 93' and 93" respectively make a first scribe 94 through all three layers, a second scribe 94' through the top two layers and a third scribe 94" through the top layer. An ink jet nozzle 95 is attached to the process head and is situated on a line that is parallel to the X direction and passes through the position of the first laser beam. This nozzle injects a stream of insulating fluid 96 to fill the first laser scribe 94. A second larger ink jet nozzle 97, or multiple smaller nozzles, is also attached to the process head and is situated in the X direction such that when the process head is moving over the substrate the second ink jet head 97 follows the first ink jet head 95. This second ink jet nozzle 97 injects a stream of conducting fluid 78. The nozzle 97 is situated in the Y direction such that the fluid 78 deposited on the substrate surface forms an electrically conducting bridge over the previously applied insulating fluid 26, the bridge extending from the upper electrode surface on the left side of the first scribe 94 to the lower electrode surface at the base of the second scribe 94'. As the process head moves across the substrate in the X direction, the order of the five processes carried out to form and complete the interconnect structure is as follows:—

1) Carry out first laser scribe 94 with first laser beam 93
2) Fill first laser scribe line 94 with insulating ink 96 delivered by first ink jet nozzle 95
3) Carry out second and third laser scribes 94' and 94" with second and third laser beams 93' and 93" respectively
4) Form conducting bridge across first laser scribe line 94 to second laser scribe line 94' with conducting ink 98 delivered by second ink jet nozzle 97.

Instead of moving the process head over the stationary substrate surface in the direction X (as shown), the same sequence of laser and ink jet processes can be achieved by holding the process head stationary and moving the panel in the opposite X direction.

Figure 10:
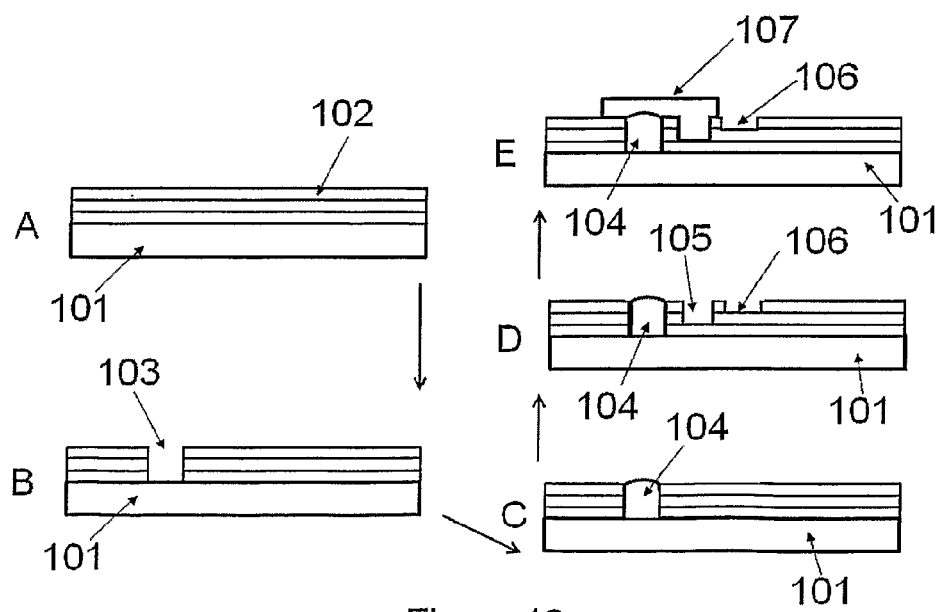
FIGS. 10A to 10E show a sequence of laser and ink jet processes delivered to a substrate surface by the apparatus shown in FIG. 9.

FIG. 10 shows the time sequence of the laser and ink jet processes delivered to the substrate surface by the apparatus shown in FIG. 9. FIG. 10A shows a substrate 101 on which a stack of layers 102 consisting of a lower electrode layer, an active layer and an upper electrode layer has been deposited. These layers are applied sequentially without any intermediate laser processes. FIG. 10B shows the first laser process that is then carried out. A first laser scribe 103 is made that penetrates all three layers as far as the substrate. After the first laser beam scribes through the layers, an ink jet process is performed. FIG. 10C shows how an insulating fluid 104 is applied into the first laser scribe 103 by means of an ink jet nozzle (not shown). The fluid 104 is immediately UV cured or later thermally cured to form a solid. Following this ink jet process second and third laser scribes are performed. FIG. 10D shows second laser scribe 105 that penetrates the top two layers but not the lower electrode layer. It also shows third laser scribe 106 that is made parallel to and beside the second scribe 105 on the side away from the first scribe 103. This scribe 106 can also penetrate partially or fully into the active layer but cannot damage the lower electrode layer. Second and third laser scribes 105, 106 can be performed at exactly the same time or they can be carried out sequentially. The order in which they are made is not critical. After second and third laser scribes 105, 106 have been made, the cell interconnection is completed by the final ink jet printing process. FIG. 10E shows the final step where a fluid 107 that is conducting or contains conducting particles is applied by means of an ink jet nozzle (not shown) over the insulating material in the first scribe 103 and also into the second laser scribe 105. The fluid 107 is subsequently thermally cured to form a solid. The fluid 107 does not extend into the third scribe 106. The conducting material 107 forms a bridge over the insulating material 104 to electrically connect the top electrode layer on the left side to the bottom electrode layer on the right side to connect adjacent cells in series.

Figure 11:
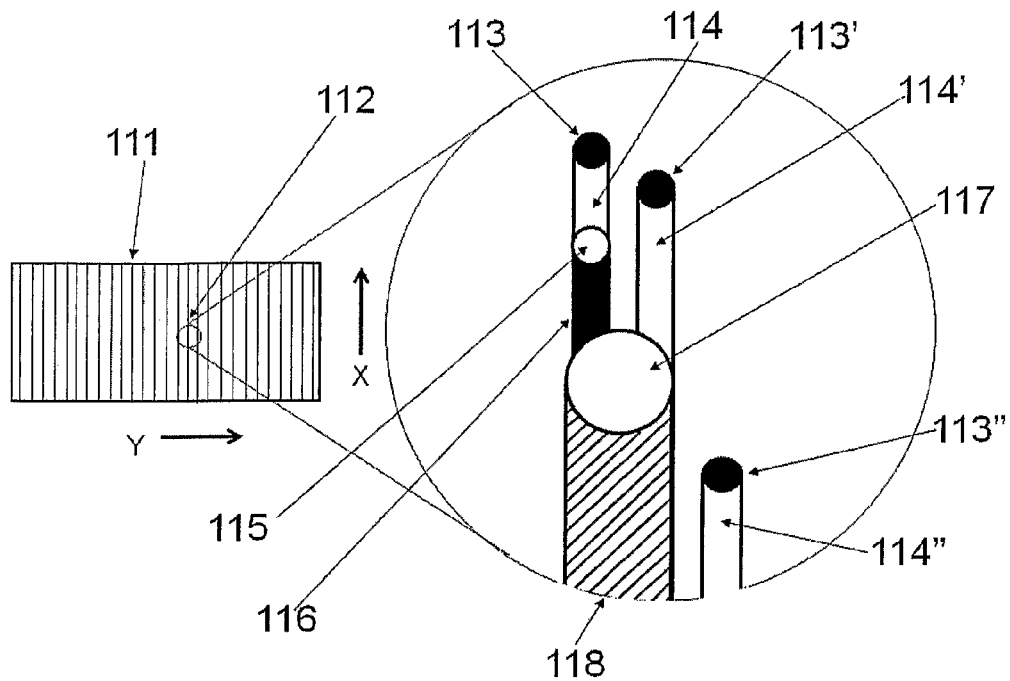
FIG. 11 shows an enlarged, schematic, plan view of apparatus according to a fourth embodiment of the invention.

FIG. 11 shows a fourth version of part of apparatus according to a fourth embodiment of the invention. It shows a fourth arrangement of the three laser beams and two ink jet nozzles that are attached to the process head in order to make a single cell interconnect structure. A solar panel 111 has multiple cells along its length in direction Y. This means that interconnections are made by moving the panel with respect to the process head in the X direction. An area 112 of the panel that includes a region where adjacent cells are connected is shown enlarged on the right side of the figure and shows part of the moving process head with its associated laser beams and ink jet nozzles that correspond to a single cell interconnect structure. First, second and third laser beams 113, 113' and 113", respectively, make a first scribe 114 through all three layers, a second scribe 114' through the top two layers and a third scribe 114" through the top layer. The figure shows the process head and attached laser beams moving in the X direction such that on the substrate surface the first laser beam 113 is in advance of the second 113' which is likewise in advance of the third 113". An ink jet nozzle 115 is attached to the process head and is situated on a line that is parallel to the X direction and passes through the position of the first laser beam 113. This nozzle 115 injects a stream of insulating fluid 116 to fill the first laser scribe 114. A second larger ink jet nozzle 117, or multiple smaller nozzles, is also attached to the process head and is situated in the X direction such that when the process head is moving over the substrate the second ink jet head 117 follows the first ink jet head 115. This second ink jet nozzle 117 injects a stream of conducting fluid 118. The nozzle 117 is situated in the Y direction such that the fluid 118 deposited on the substrate surface forms an electrically conducting bridge over the previously applied insulating fluid 116, the bridge extending from the upper electrode surface on the left side of the first scribe 114 to the lower electrode surface at the base of the second scribe 114'. As the process head moves across the substrate in the X direction, the order of the five processes carried out to form and complete the interconnect structure is as follows:—

1) Carry out first and second laser scribes 114, 114' with first and second laser beams 113, 113'
2) Fill first laser scribe line 114 with insulating ink 116 delivered by first ink jet nozzle 115
3) Form conducting bridge across first laser scribe line 114 to second laser scribe line 114' with conducting ink 118 delivered by second ink jet nozzle 117.
4) Carry out third laser scribe 114" with third laser beam 113"

Instead of moving the process head over the stationary substrate surface in the direction X (as shown), the same sequence of laser and ink jet processes can be achieved by holding the process head stationary and moving the panel in the opposite X direction.

Figure 12:
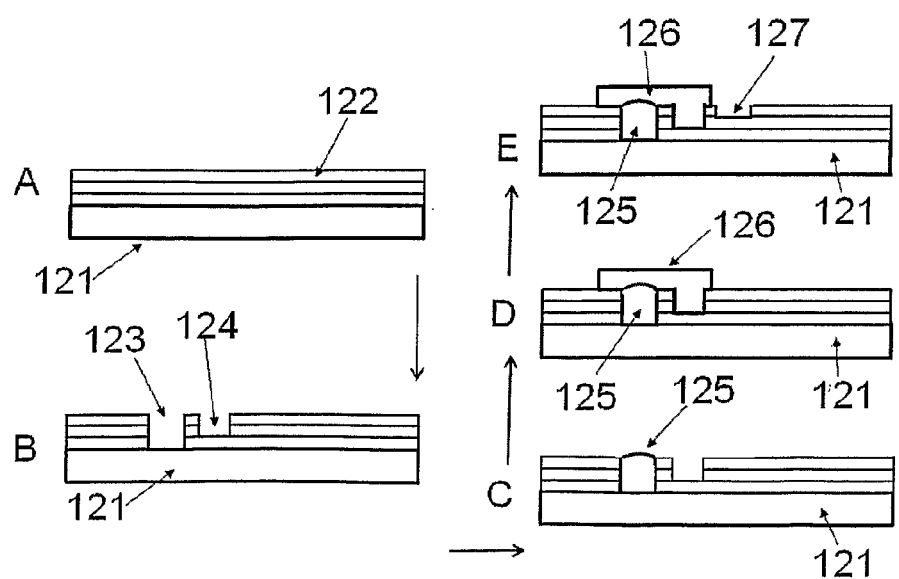
FIGS. 12A to 12E show a time sequence of laser and ink jet processes delivered to a substrate surface by the apparatus shown in FIG. 11.

FIG. 12 shows the time sequence of the laser and ink jet processes delivered to the substrate surface by the apparatus shown in FIG. 11. FIG. 12A shows a substrate 121 on which a stack of layers 122 consisting of a lower electrode layer, an active layer and an upper electrode layer has been deposited. These layers are applied sequentially without any intermediate laser processes. FIG. 12B shows the two laser processes that are then carried out. A first laser scribe 123 is made that penetrates all 3 layers as far as the substrate. A second laser scribe 124 penetrates the top two layers but not the lower electrode layer. These two laser scribes can be performed at exactly the same time or they can be carried out sequentially. The order in which they are made is not critical. After both laser processes have been completed materials are applied by ink jet printing. FIG. 12C shows how an insulating fluid 125 is applied into the first laser scribe 123 by means of an ink jet nozzle (not shown). The fluid 125 is immediately UV cured or later thermally cured to form a solid. FIG. 12D shows the next step where a fluid 126 that is conducting or contains conducting particles is applied by means of an ink jet nozzle (not shown) over the insulating material 125 in the first scribe 123 and also into the second laser scribe 124. The fluid 126 is subsequently thermally cured to form a solid. The conducting material 126 forms a bridge over the insulating material 125 to electrically connect the top electrode layer on the left side to the bottom electrode layer on the right side to connect adjacent cells in series. FIG. 12E shows the last step in the interconnection process where a third laser scribe that penetrates the upper layer 127 is made parallel to and beside the second scribe on the side away from the first scribe. This scribe can also penetrate partially or fully into the active layer but cannot damage the lower electrode layer. The advantage of carrying out this third laser scribe after the conducting ink jet application process is that the laser scribe can be used to remove any conducting ink that may have spread across the surface of the upper electrode into the region of the third scribe.

Figure 13:
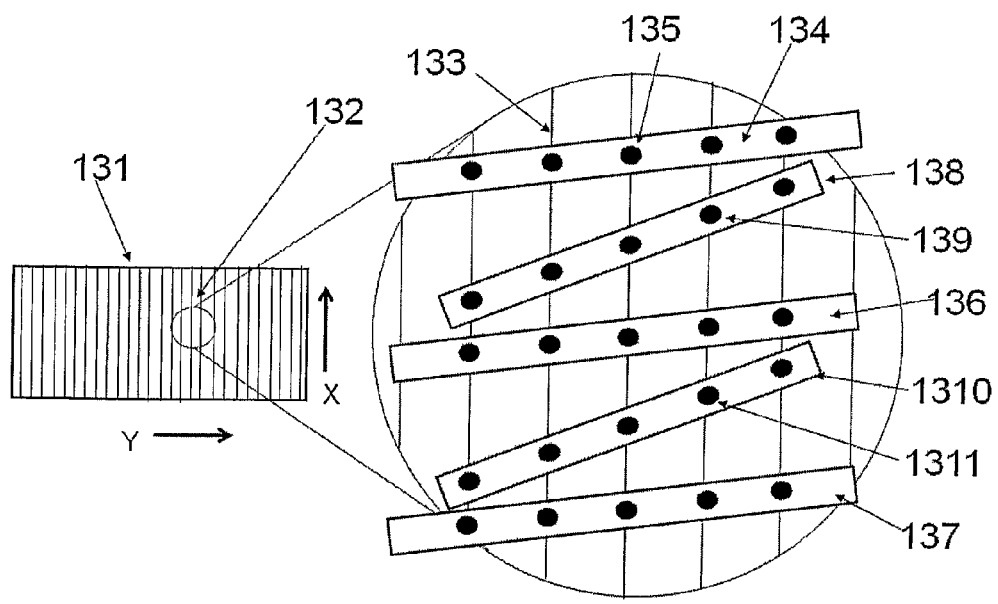
FIG. 13 shows an enlarged, schematic, plan view of part of a process head used in a preferred embodiment of the invention. It shows how arrays of laser beams and arrays of ink jet nozzles can be mounted on the process head and used to form multiple adjacent cell interconnecting structures in a single pass over the panel as illustrated in FIGS. 5 and 6.

FIG. 13 shows how an individual interconnect process unit as shown in FIG. 5 is expanded into a device that can process multiple interconnect structures in parallel. 131 is a solar panel with multiple cells along its length in direction Y. 132 is an area of the panel 131 that includes the connections between several cells. This area 132 is enlarged on the right of the figure and shows part of the moving process head with its associated laser beams and ink jet nozzles that correspond to (in this case) 5 cell interconnect structures 133. 134 is a device that positions 5 parallel first laser beams 135 along a line. The device can be rotated about an axis perpendicular to the paper to set the beam spacing correctly in the Y direction. The row of 5 beams makes 5 parallel first cuts through the 3 layers. 136 is a device that positions 5 parallel second laser beams along a line in order to make 5 parallel second cuts through the top 2 layers. The device can also be rotated about an axis perpendicular to the paper to set the beam spacing correctly. 137 is a device that positions 5 parallel third laser beams along a line in order to make 5 parallel third cuts through the top layer. The device can be rotated about an axis into the paper to set the beam spacing correctly. 138 is a device that positions 5 parallel first ink jet nozzles 139 along a line in order to apply 5 parallel lines of insulating fluid into the 5 first laser cuts. The device can be rotated about an axis perpendicular to the paper to set the nozzle spacing correctly. 1310 is a device that positions 5 parallel second ink jet nozzles 1311 along a line in order to apply 5 parallel lines of conducting fluid over the insulating fluid in the 5 first cuts and into the 5 second laser cuts. The device can be rotated about an axis perpendicular to the paper to set the nozzle spacing correctly. The panel 131 and process head are moved relative to each other in the X direction so that areas of the substrate see in succession:—
1) the row of first laser beams,
2) the row of first ink jet heads,
3) the row of second laser beams,
4) the row of second ink jet heads and
5) the row of third laser beams.

Figure 14:
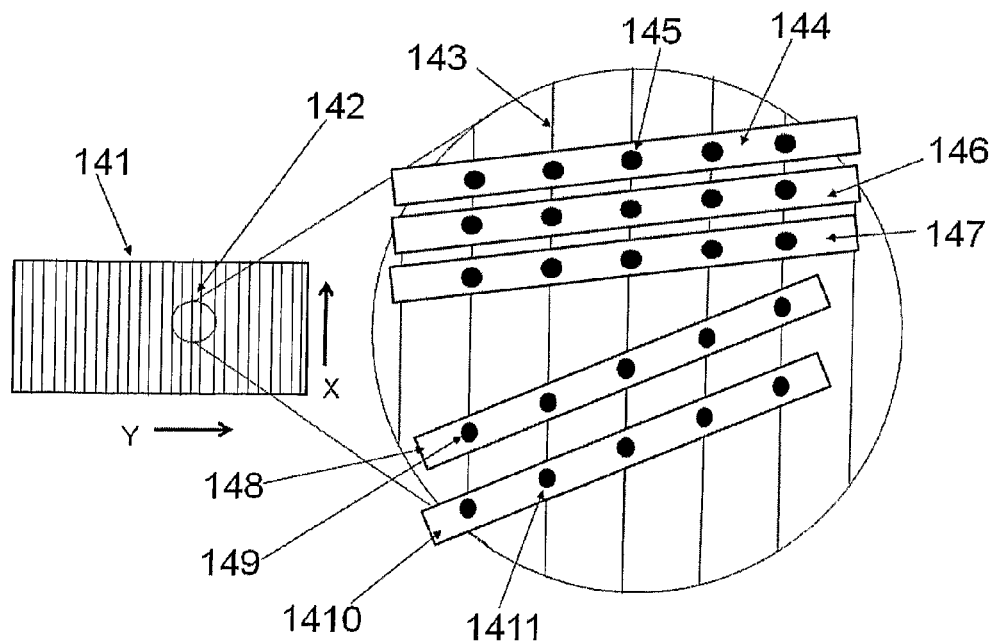
FIG. 14 shows an enlarged, schematic, plan view of part of a process head used in a further embodiment of the invention. It demonstrates how arrays of laser beams and arrays of ink jet nozzles can be mounted on the process head and used to form multiple adjacent cell interconnecting structures in a single pass over the panel as illustrated in FIGS. 7 and 8.

FIG. 14 shows how an individual interconnect process unit as shown in FIG. 7 is expanded into a device that can process multiple interconnect structures in parallel. 141 is a solar panel with multiple cells along its length Y. 142 is an area of the panel 141 that includes the connections between several cells. This area 142 is enlarged on the right of the figure and shows part of the moving process head with its associated laser beams and ink jet nozzles that correspond to (in this case) 5 cell interconnect structures 143. 144 is a device that positions 5 parallel first laser beams 145 along a line. The device can be rotated about an axis perpendicular to the paper to set the beam spacing in the Y direction correctly. The row of 5 beams makes 5 parallel first cuts through the 3 layers. 146 is a device that positions 5 parallel second laser beams along a line in order to make 5 parallel second cuts through the top 2 layers. The device can be rotated about an axis perpendicular to the paper to set the beam spacing correctly. 147 is a device that positions 5 parallel third laser beams along a line in order to make 5 parallel third cuts through the top layer. The device can be rotated about an axis perpendicular to the paper to set the beam spacing correctly. 148 is a device that positions 5 parallel first ink jet nozzles 149 along a line in order to apply 5 parallel lines of insulating fluid into the 5 first laser cuts. The device can be rotated about an axis perpendicular to the paper to set the nozzle spacing correctly. 1410 is a device that positions 5 parallel second ink jet nozzles 1411 along a line in order to apply 5 parallel lines of conducting fluid over the insulating fluid in the 5 first cuts and into the 5 second laser cuts. The device can be rotated about an axis perpendicular the paper to set the nozzle spacing correctly. The panel 141 and process head are moved relative to each other in the X direction so that areas of the substrate see in succession:—
1) the row of first laser beams,
2) the row of second laser beams,
3) the row of third laser beams,
4) the row of first ink jet nozzles and
5) the row of second ink jet nozzles.

Figure 15:
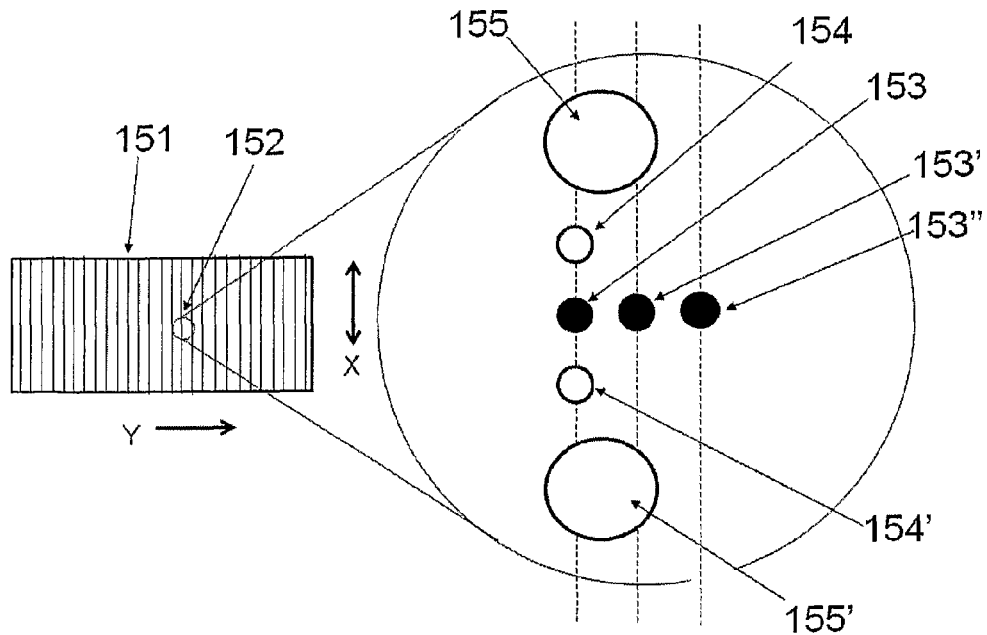
FIG. 15 shows an enlarged, schematic, plan view of apparatus according to a fifth embodiment of the invention; it shows an arrangement of the three laser beams and two sets of associated ink jet nozzles that are attached to a process head in order to make single cell interconnect structures by moving the process head in either direction.

FIG. 15 shows part of apparatus according to a fifth embodiment of the invention. It shows a fifth arrangement of the three laser beams and associated ink jet nozzles that are attached to the process head in order to make a single cell interconnect structure. In this case, two first ink jet heads and two second ink jet heads are fitted to allow operation of the head in either direction. A solar panel 151 has multiple cells along its length in direction Y. This means that interconnections are made by moving the panel with respect to the process head in either of the X directions. An area 152 of the panel that includes a region where adjacent cells are connected is shown enlarged on the right side of the figure and shows part of the moving process head with its associated laser beams and ink jet nozzles that correspond to a single cell interconnect structure. First, second and third laser beams 153, 153' and 153", respectively, make a first scribe through all three layers, a second scribe through the top two layers and a third scribe through the top layer. Two first ink jet nozzles 154, 154' are attached to the process head and are situated on each side of the first laser beam on a line that is parallel to the X direction and passes through the position of the first laser beam 153. These first nozzles inject a stream of insulating fluid to fill the first laser scribe. Two second, larger, ink jet nozzles, or multiple smaller nozzles, 155, 155' are also attached to the process head and are situated on each side of the first laser beam on a line that is parallel to the X direction and passes through a position close to the first laser beam 153. These second ink jet nozzles inject a stream of conducting fluid. The nozzles 155, 155' are situated in the Y direction such that the conducting fluid deposited on the substrate surface forms an electrically conducting bridge over the previously applied insulating fluid, the bridge extending from the upper electrode surface on the left side of the first scribe to the lower electrode surface at the base of the second scribe. As the process head moves across the substrate in either of the X directions, one or other of each first ink jet nozzle and one or other of the corresponding second ink jet nozzle are activated such that the order of the five processes carried out to form and complete the interconnect structure is as follows:—
1) Carry out first, second and third laser scribes with first, second and third laser beams.
2) Fill first laser scribe line with insulating ink delivered by either first ink jet nozzle 154 or 154' depending on the head travel direction
3) Form conducting bridge across first laser scribe line to second laser scribe line with conducting ink delivered by either second ink jet nozzle 155 or 155' depending on the head travel direction.

Instead of moving the process head over the stationary substrate surface in the direction X (as shown), the same sequence of laser and ink jet processes can be achieved by holding the process head stationary and moving the panel in the opposite X direction.

Figure 16:
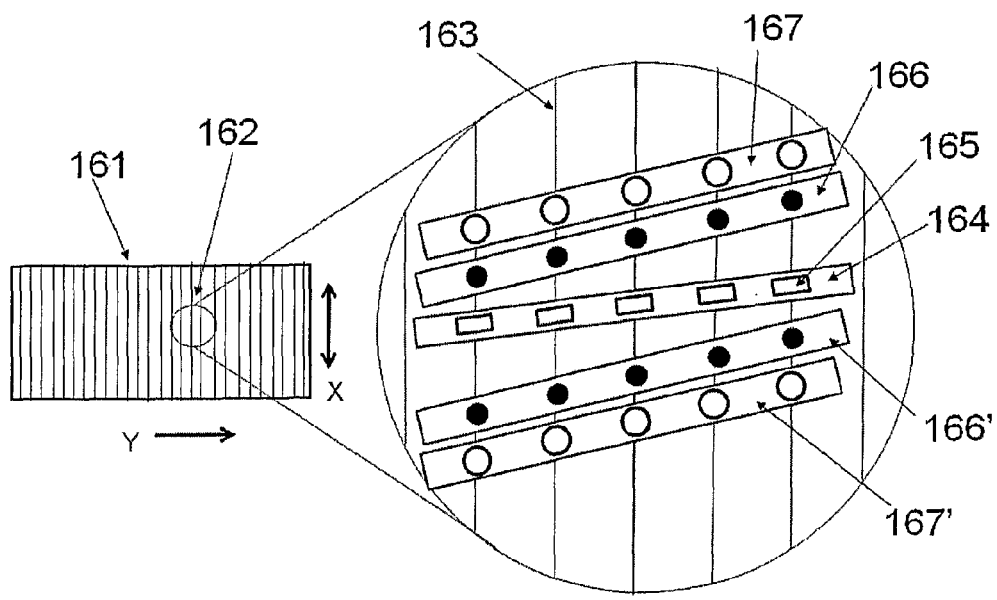
FIG. 16 shows an enlarged, schematic, plan view of part of a process head used in the fifth embodiment of the invention. It demonstrates how an array of laser beams and, two arrays of ink jet nozzles can be mounted on the process head and used to form multiple adjacent cell interconnecting structures in a single pass in either direction over the panel as illustrated in FIGS. 7 and 15.

FIG. 16 shows how an individual interconnect process unit as shown in FIG. 15 is expanded to provide a device that can simultaneously process multiple interconnect structures in parallel. 161 is a solar panel with multiple cells along its length Y. 162 is an area of the panel 161 that includes the connections between several cells. This area 162 is enlarged on the right of the figure and shows part of the moving process head with its associated laser beams and ink jet nozzles that correspond to (in this case) 5 cell interconnect structures 163. 164 is a device that positions 5 parallel first, second and third laser beams 165 along a line. Individual beams are not shown. The device can be rotated about an axis perpendicular to the paper to set the beam spacing in the Y direction correctly. The row of 5 sets of first, second and third beams makes 5 parallel first cuts through the 3 layers, 5 parallel second cuts through the second and third layers and 5 parallel third cuts through the top layer. 166 and 166' are devices that each position 5 parallel first ink jet nozzles along a line in order to apply 5 parallel lines of insulating fluid into the 5 first laser cuts. The devices can be rotated about axes perpendicular to the paper to set the nozzle spacing correctly. Either set of first ink jet nozzles 166 or 166' is activated depending on the direction of travel of the process head in the X direction with respect to the substrate surface such that the insulating ink application follows the first laser cut. 167 and 167' are devices that each position 5 parallel second ink jet nozzles along a line in order to apply 5 parallel lines of conducting fluid over the insulating fluid in the 5 first cuts and into the 5 second laser cuts. The devices can be rotated about axes perpendicular the paper to set the nozzle spacing correctly. Either set of second ink jet nozzles 167 or 167' is activated depending on the direction of travel of the process head in the X direction with respect to the substrate surface such that the conducting ink application follows the insulating ink application which follows the first and second laser cuts. The panel 151 and process head are moved relative to each other in either X direction so that areas of the substrate see in succession:—
1) the row of first, second and third laser beams,
2) a row of first ink jet nozzles and
3) a row of second ink jet nozzles.

Figure 17:
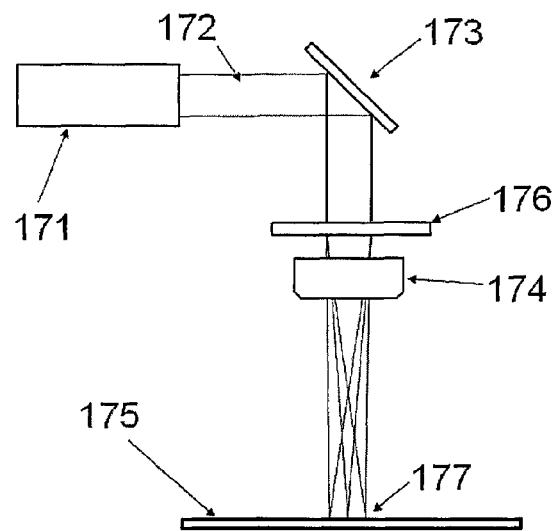
FIG. 17 shows apparatus that uses a diffractive optical element to split a beam from a single laser to form first, second and third laser beams.

FIG. 17 shows apparatus by means of which the beam from a single laser unit is divided to form one set of first, second and third laser beams in order to create a single cell to cell interconnect structure on the substrate. First and second ink jet heads that are associated with the three laser beams are not shown in the figure. Pulsed laser unit 171 emits a beam 172 that is directed by mirror 173 through focussing lens 174 to form a focal spot on the surface of the substrate 175. Diffractive optical element (DOE) 176 situated in the beam splits the beam into three angularly separated beams each of which is focussed by lens 174 to create a line of three focal spots 177 on the substrate surface corresponding to the first, second and third laser beams associated with a single interconnect structure. The properties of the laser beam 172 and the focal length of the lens 174 define the size of the focal spots on the surface. The design of the DOE 176 defines the angular spacing between the three beams and hence, together with the lens focal length, the separation of the spots on the substrate surface. The DOE can also be designed to control the relative laser power in each spot to match the separate requirements for the first, second and third laser cut processes. Rotation of the DOE allows adjustment of the focal spot spacing in the direction perpendicular to the direction of travel. The use of DOEs for splitting laser beams into multiple separate beams is well known.

In practice, laser spot sizes in the range 0.05 mm to 0.1 mm are used with inter-spot spacings of two or three times the spot diameter. The laser power required in the first beam in order to perform the first cut through all three layers to the substrate surface is generally significantly higher than that required in the second and third beams. For example, for a solar panel consisting of a lower electrode layer of Molybdenum, an active layer of CIGS and an upper electrode layer of ZnO with an IR laser generating laser spots with diameters of 0.1 mm moving at a speed of 200 mm per second over the substrate surface, a laser power in the first beam in the range 5 W to 10 W has been found to make a satisfactory first cut whereas powers of only a few W are required in the second and third beams for the second and third cuts.

Figure 18A:
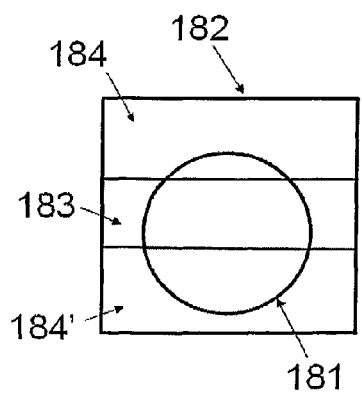
FIGS. 18A and 18B show how a prismatic type optical component is used to split abeam from a laser into three angularly separated beams.
Figure 18B:
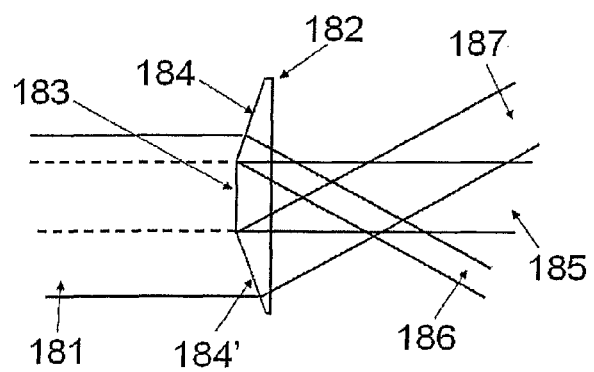

FIGS. 18A and 18B show another example of apparatus by means of which the beam from a single laser unit is divided to form one set of first, second and third laser beams in order to create a single cell to cell interconnect structure on the substrate. FIG. 18A shows a plan view of a round laser beam 181 falling on a special truncated transmissive bi-prism 182. Region 183 in the centre of the device is a flat region separating two prismatic regions 184, 184'. The centre of the bi-prism is displaced from the centre of the beam. FIG. 18B shows a side view of the laser beam 181 passing through special truncated bi-prism 182 and dividing it into three separate angularly separated beams 185, 186 187. The part of the laser beam 181 that is incident on the flat part of the device 183 passes through the device without deviation to form beam 185. The parts of the laser beam that pass through the two prismatic parts of the device 184, 184' are deviated to form beams 186 and 187, respectively. Due to the displacement of the bi-prism from the centre of the laser beam more laser power is delivered in beam 187 compared to beam 186. By adjustment of the width of the truncated region of the bi-prism 183 and displacement of the bi-prism centre from the beam centre the power in each beam can be set to a required level. The use of bi-prisms of various types for dividing beams into two or more angularly separated beams is well known.

Figure 19:
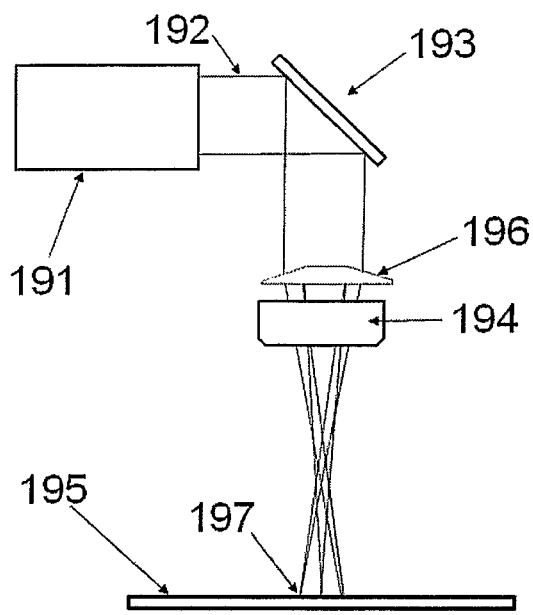
FIG. 19 shows apparatus that uses a prismatic type optical component to split a beam from a single laser to form first, second and third laser beams.

FIG. 19 shows apparatus by means of which the prismatic device shown in FIG. 18 is used to divide the beam from a single laser unit to form one set of first, second and third laser beams in order to create a single cell to cell interconnect structure on the substrate. First and second ink jet heads that are associated with the three laser beams are not shown in the figure. Pulsed laser unit 191 emits a beam 192 that is directed by mirror 193 through focussing lens 194 to form a focal spot on the surface of the substrate 195. Truncated bi-prism device 196 situated in the beam splits the beam into three angularly separated beams each of which is focussed by lens 194 to create a line of three focal spots 197 on the substrate surface corresponding to the first, second and third laser beams associated with a single interconnect structure. The properties of the laser beam 192 and the focal length of the lens 194 define the size of the focal spots on the surface. The design of the truncated bi-prism device 196 defines the angular spacing between the three beams and hence, together with the lens focal length, the separation of the spots on the substrate surface. The bi-prism can also be designed to control the relative laser power in each spot to match the separate requirements for the first, second and third laser cut processes. Rotation of the bi-prism about an axis through its centre and normal to its surface allows adjustment of the focal spot spacing in the direction perpendicular to the direction of substrate travel.

Figure 20:
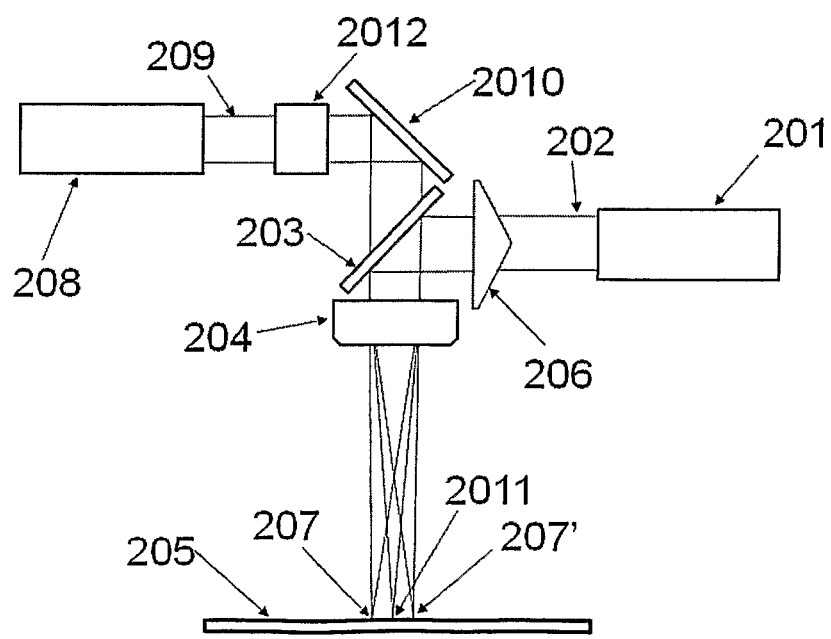
FIG. 20 shows apparatus that uses a bi-prism or diffractive optical element to split a beam from a single laser to form two laser beams which are then combined with a third beam.

FIG. 20 shows apparatus by means of which the beam from a first laser unit is divided to form two of the first, second or third laser beams which are then combined with the beam from a second laser to form three beams in total in order to create a single cell to cell interconnect structure on the substrate. First and second ink jet heads that are associated with the three laser beams are not shown in the figure. Pulsed first laser unit 201 emits a beam 202 that is directed by beam combining mirror 203 through focussing lens 204 to form a focal spot on the surface of the substrate 205. Optical element 206 which can be a DOE or a bi-prism situated in the beam 202 splits the beam into two angularly separated beams each of which is focussed by lens 204 to create two focal spots 207, 207' on the substrate surface corresponding to any two of the first, second or third laser beams associated with a single interconnect structure. The properties of the laser beam 202 and the focal length of the lens 204 define the size of the focal spots on the surface. The design of the DOE or bi-prism 206 defines the angular spacing between the two beams and hence, together with the lens focal length, the separation of the spots on the substrate surface. Rotation of the DOE or bi-prism about an axis through its centre and perpendicular to its surface allows adjustment of the focal spot spacing in the direction perpendicular to the direction of substrate travel.

Second laser unit 208 emits beam 209 that is directed by mirror 2010 through beam combining mirror 203 and through focussing lens 204 to form a focal spot 2011 on the surface of the substrate 205. Adjustment of mirror 2010 allows the focal spot produced by the second laser 2011 to be located at any desired position on the substrate surface with respect to the two spots created by the first laser beam 207, 207'. The second laser unit 208 can have the same or different wavelength of operation to the first laser unit 201. If the wavelengths of the first and second lasers are the same the beam combining mirror 203 is polarization, sensitive so that it transmits a beam that is incident with so called p-polarization and reflects a laser beam that has so called s-polarisation. In the case shown in the figure, first laser 201 would thus be s-polarized and second laser 208 would be p-polarised at the beam combining mirror 203. Using two lasers of the same wavelength allows operation of one laser scribe at a different repetition rate and pulse length to the other two laser scribes. If the wavelengths of the first and second lasers are different then the beam combining mirror 203 is wavelength sensitive so that it reflects the beam from the first laser 201 and transmits the beam from the second laser 208. Beam divergence compensation optics 2012 situated in one or both beams are generally required when using a common focussing lens for focussing the beams from two lasers onto the substrate. This is especially important when the beams have different wavelengths but is also desirable when the wavelengths are the same. Using two lasers of different wavelength allows operation of one laser scribe at a different wavelength to the other two laser scribes. Such an arrangement is often advantageous in terms of making cuts in the upper two layers without damaging the first layer. Preferred laser wavelengths for making the various laser cuts are in the IR, visible and UV ranges. Particular examples are 1064 nm, 532 nm or 355 nm. Use of beam combining mirrors of polarisation type or wavelength sensitive (so called di-chroic) type is well known.

Figure 21:
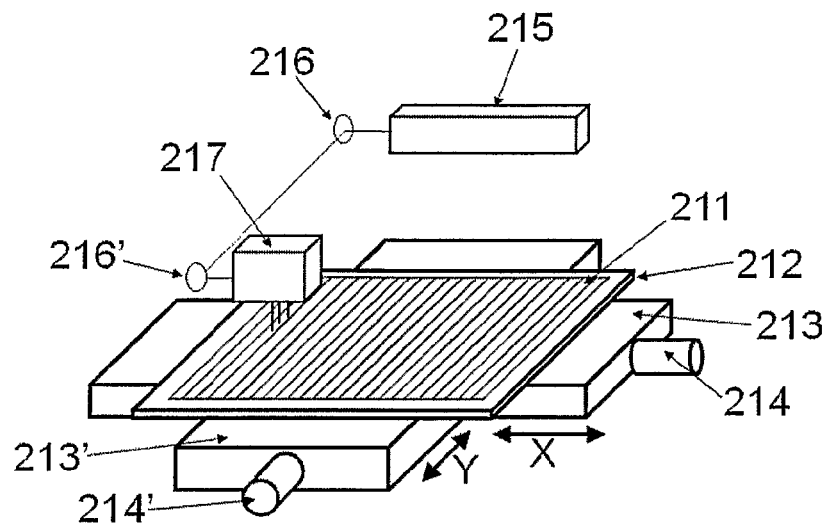
FIG. 21 shows apparatus for moving a substrate in two directions with respect to the process head.

FIG. 21 shows apparatus appropriate for carrying out the cell interconnection process on a thin film solar panel. Solar panel 211 is mounted on flat chuck plate 212 which is mounted on translation stages 213 and 213' driven by servo motors 214, 214' so that the panel is able to move in two orthogonal directions X and Y parallel to the edges of the panel. The beam from laser unit 215 is directed by mirrors 216, 216' to a process head 217 that is mounted over the panel. Details of the optics in the process head to split the beam into first, second and third laser beams as well as the associated first and second ink jet heads on the process head are not shown in the figure. In operation, the process head is stationary and the panel is moved in a series of linear moves in the Y direction each pass across the substrate being followed by a step in the X direction. The process head may process a single cell interconnect on each pass or in a preferred situation may process multiple interconnects on each pass. The figure shows a stationary process head with the substrate moving in two axes but in practice other arrangements are possible. A preferred arrangement has the substrate moving in one axis and the process head moving in the other. An arrangement where the process head moves in two orthogonal axes over a stationary substrate is also possible.

Figure 22:
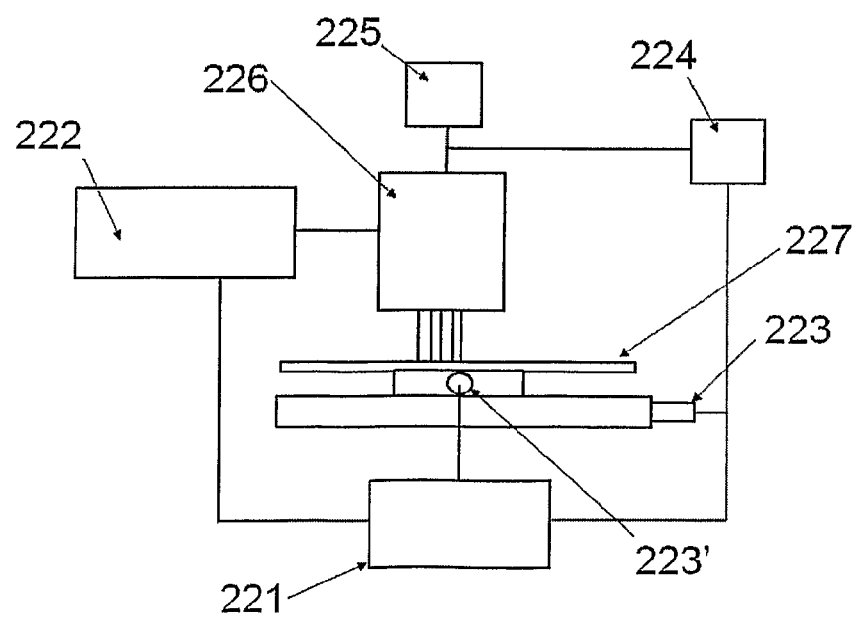
FIG. 22 shows apparatus for controlling the operation of the laser or lasers, the ink jet heads and the motion systems.

FIG. 22 shows apparatus appropriate for controlling the equipment shown in FIG. 21. Control unit 221 generates signals that control the laser 222, the stage servo motors 223, 223' and the ink jet print head controller 224, associated ink jet delivery system 225 and ink jet print heads mounted in process head 226. In the embodiments described above, the first second and third cuts are all formed using a laser beam to cut through the relevant layer(s). Whilst, in many cases, this is the preferred method of forming the cuts, one or more of the cutter units on the processing head may comprise other forms of cutter means. Another way to form a cut though one or more layers is by the use of a mechanical scriber, such as a fine wire or multiple parallel styli, carried by a precision unit such as manufactured by Lehmann Präzisionstechnik GmbH. Thus, one or more of the lasers in the embodiments described above may be replaced by a mechanical scriber.

In many cases, the first cut will be formed using a laser but the second and third cuts can be formed by laser or by a mechanical scriber. However, all cuts could be formed by laser (as described above) or all cuts could be formed by mechanical scriber or any combination of laser and mechanical scriber.

The invention claimed is:

1. A method for dividing a thin film device having a first layer which is a lower electrode layer, a second layer which is an active layer and a third layer which is an upper electrode layer, all the layers being continuous over the device, into separate cells which are electrically interconnected in series, the dividing of the cells and the electrical connection between adjacent cells all being carried out in a single pass of a process head across the device, the process head performing the following steps in the single pass:

a) making a first cut through the first, second and third layers;
b) making a second cut through the second and third layers, the second cut being adjacent to the first cut;
c) making a third cut through the third layer the third cut being adjacent to the second cut and on the opposite side of the second cut to the first cut;
d) using a first ink jet print head to deposit a non-conducting material into the first cut; and
e) using a second ink jet print head to apply conducting material to bridge the non-conducting material in the first cut and either fully or partially fill the second cut such that an electrical connection is made between the first layer and the third layer,
wherein step (a) precedes step (d), step (d) precedes step (e) and step (b) precedes step (e), otherwise the steps may be carried out in any order in the single pass of the process head across the device.

2. A method as claimed in claim 1 in which the order in which the steps are carried out in the single pass is determined by the relative positions on the process head of the first and second ink jet print heads and components on said process head for forming said first, second and third cuts.

3. A method as claimed in claim 1 in which one or more of the first, second and third cuts are formed using one or more laser beams.

4. A method as claimed in claim 1 in which one or more of the first, second and third cuts are formed using one or more mechanical scribers.

5. A method as claimed in claim 1 in which the process head is able to carry out all said steps in a single pass in either or both directions across the thin film device.

6. A method as claimed in claim 1 in which one or more curing steps are carried out to cure said non-conducting material and/or said conducting material after deposition into the respective cut.

7. A method as claimed in claim 6 in which one or more of said curing steps are carried out during said single pass after deposition of the non-conducting material and/or said conducting material.

8. A method as claimed in claim 6 in which one or more of said curing steps are carried out in separate apparatus after said single pass.

9. A method as claimed in a claim 1 in which the thin film device is one of the following: a solar panel, a lighting panel and a battery.

10. An apparatus for dividing a thin film device having a first layer which is a lower electrode layer, a second layer which is an active layer and a third layer which is an upper electrode layer, all the layers being continuous over the device, into separate cells which are electrically interconnected in series, the apparatus comprising a process head on which are provided: a) one or more cutters positioned on the process head to make, during a single pass cutter units for malting a first cut through the first, second and third layers, a second cut through the second and third layers adjacent to the first cut and a third cut through the third layer adjacent to the second cut and on the opposite side of the second cut to the first cut; b) a first ink jet print head positioned on the process head to deposit for depositing a non-conducting material into the first cut during the single pass; and c) a second ink jet print head positioned on the process head to apply for applying conducting material to bridge the non-conducting material in the first cut and either fully or partially fill the second cut during the single pass so that an electrical connection is made between the first layer and the third layer, the apparatus also comprising: d) a drive that moves the process head relative to the device; and e) a controller adapted to control means for controlling movement of the process head relative to the device and to actuate the one or more cutters and the first and second ink jet print heads so that division of the device into separate cells and the formation of an electrical connection between adjacent cells can all be carried out in the single pass of the process head across the device.

11. Apparatus as claimed in claim 10 in which the one or more cutters comprises a single pulsed laser to form the first, second and third cuts.

12. Apparatus as claimed in claim 10 in which the one or more cutters comprise pulsed lasers of two or more types to form the first, second and/or third cuts.

13. Apparatus as claimed in claim 11 which comprises a focussing lens to deliver first, second and third laser beams to the device, an angular deviation is provided between the beams such that the focal spots at a focus of the lens formed by the first, second and third laser beams have a required spatial separation on a surface of the device surface to form the first, second and third cuts.

14. Apparatus as claimed in claim 11 comprising a diffractive optical element to split a laser beam from a pulsed laser to form first, second and third laser beams to form the first, second and third cuts.

15. Apparatus as claimed in claim 11 comprising a prismatic optical element to split a laser beam from a pulsed laser to form first, second and third laser beams to form the first, second and third cuts.

16. Apparatus as claimed in claim 11 comprising a diffractive optical element to split a laser beam from a first pulsed laser to form any two of the first, second and third laser beams, and a second pulsed laser to provide the remaining laser beam arranged such that beams from the first and second pulsed lasers combine to form three spatially separated laser spots on the surface of the device for to form the first, second and third cuts.

17. Apparatus as claimed in claim 11 comprising a prismatic optical element of bi-prism type to split a laser beam from a first pulsed laser to form any two of the first, second and third laser beams, and a second pulsed laser to provide the remaining laser beam arranged such that the beams from the first and second pulsed lasers combine to form three spatially separated laser spots on the surface of the device to form the first, second and third cuts.

18. Apparatus as claimed in claim 10 in which the drive comprises a dual axis servo motor to move the process head relative to the device in two orthogonal directions.

19. Apparatus as claimed in claim 10 in which the controller is arranged so that the device and process head move relative to each other in a first direction parallel to the lengths of the first and second cuts in a continuous path across the device and at the end of the path to step in a direction perpendicular to the first direction by a predetermined distance equal to the width of the cells to be formed in the device.

* * * * *